United States Patent
Goodwin

(10) Patent No.: US 9,243,896 B2
(45) Date of Patent: Jan. 26, 2016

(54) TWO AXIS ENCODER HEAD ASSEMBLY

(71) Applicant: NIKON CORPORATION, Tokyo (JP)

(72) Inventor: Eric Peter Goodwin, Tucson, AZ (US)

(73) Assignee: Nikon Corporation (JP)

(*) Notice: Subject to any disclaimer, the term of this patent is extended or adjusted under 35 U.S.C. 154(b) by 337 days.

(21) Appl. No.: 13/796,316

(22) Filed: Mar. 12, 2013

(65) Prior Publication Data

US 2014/0049762 A1    Feb. 20, 2014

Related U.S. Application Data

(60) Provisional application No. 61/683,593, filed on Aug. 15, 2012.

(51) Int. Cl.
   *G03B 27/54* (2006.01)
   *G03B 27/52* (2006.01)
   *G01B 11/14* (2006.01)
   *G03F 7/20* (2006.01)

(52) U.S. Cl.
   CPC ............ *G01B 11/14* (2013.01); *G03F 7/70775* (2013.01)

(58) Field of Classification Search
   CPC ...... G03F 9/70; G03F 7/70775; G03F 9/7065
   USPC ........... 355/52, 53, 55, 67; 356/399–401, 488
   See application file for complete search history.

(56) References Cited

U.S. PATENT DOCUMENTS

| | | | |
|---|---|---|---|
| 4,710,026 A | 12/1987 | Magome et al. | |
| RE34,010 E | 7/1992 | Magome et al. | |
| 6,034,378 A * | 3/2000 | Shiraishi | 250/559.29 |
| 6,611,316 B2 | 8/2003 | Sewell | |
| 6,778,257 B2 | 8/2004 | Bleeker et al. | |
| 6,844,918 B2 * | 1/2005 | Koren et al. | 355/53 |
| 7,023,610 B2 | 4/2006 | Ohtsuki et al. | |
| 8,829,420 B2 * | 9/2014 | Goodwin et al. | 250/231.1 |
| 2011/0086315 A1 | 4/2011 | Ichinose | |

FOREIGN PATENT DOCUMENTS

WO    WO01/35168 A1    5/2001

OTHER PUBLICATIONS

U.S. Appl. No. 13/593,839, filed Aug. 24, 2012 with its entire prosecution and case history.
International Application No. PCT/US12/53727 filed Sep. 5, 2012 with its entire prosecution and case history.

* cited by examiner

*Primary Examiner* — Hung Henry Nguyen
(74) *Attorney, Agent, or Firm* — Roeder & Broder LLP; Steven G. Roeder

(57) ABSTRACT

A measurement system for measuring the position of a work piece (28) includes a stage grating (234) and an encoder head (236). A first measurement beam (38A) is directed at the stage grating (234) at a first angle, the first measurement beam (38A) being at a first wavelength. A second measurement beam (38B) is directed at the stage grating (234) at a second angle that is different than the first angle, the second measurement beam (38B) being at a second wavelength that is different than the first wavelength. At least a portion of the first measurement beam (38A) and at least a portion of the second measurement beam (38B) are interfered with one another to create a measurement signal along a signal axis.

38 Claims, 12 Drawing Sheets

TWO AXIS ENCODER HEAD ASSEMBLY

RELATED INVENTION

This application claims priority on U.S. Provisional Application Ser. No. 61/683,593, filed Aug. 15, 2012 and entitled "TWO AXIS ENCODER HEAD ASSEMBLY". As far as permitted, the contents of U.S. Provisional Application Ser. No. 61/683,593 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, a measurement system, and a control system. The measurement system constantly monitors the position of the reticle and the wafer, and the control system controls each stage assembly to constantly adjust the position of the reticle and the wafer. The features of the images transferred from the reticle onto the wafer are extremely small. Accordingly, the precise positioning of the wafer and the reticle is critical to the manufacturing of high quality wafers.

There is a constant desire to improve the accuracy of the measurement system. Additionally, it is desired to provide such a measurement system with improved accuracy, while still enabling a relatively small package size, simple construction with a relatively small number of parts, and improved sensitivity.

SUMMARY

The present embodiment is directed toward a measurement system for measuring the position of a work piece. In certain embodiments, the measurement system comprises a stage grating coupled to the work piece; and an encoder head that is positioned near the stage grating. Additionally, a first measurement beam is directed at the stage grating at a first angle, the first measurement beam being at a first wavelength; and a second measurement beam is directed at the stage grating at a second angle that is different than the first angle, the second measurement beam being at a second wavelength that is different than the first wavelength. Further, at least a portion of the first measurement beam and at least a portion of the second measurement beam are interfered with one another to create a measurement signal along a signal axis. In one such embodiment, the first measurement beam and the second measurement beam are directed together at the stage grating.

In one embodiment, the stage grating is a two-dimensional grating.

Additionally, in some embodiments, the encoder head includes a first redirector and a second redirector. In such embodiments, the first measurement beam being diffracted by the stage grating creates at least a +1 first order beam and a −1 first order beam, with the +1 first order beam being directed at the first redirector and the −1 first order beam being directed at the second redirector. Further, the first redirector redirects the +1 first order beam back at the stage grating, and the second redirector redirects the −1 first order beam back at the stage grating.

Further, in one embodiment, the encoder head further includes a first beam adjuster that is positioned near the first redirector and a second beam adjuster that is positioned near the second redirector. In such embodiment, the +1 first order beam is directed at the first beam adjuster to correct the diffraction angle of the +1 first order beam; and the −1 first order beam is directed at the second beam adjuster to correct the diffraction angle of the −1 first order beam.

In certain embodiments, the first measurement beam is directed twice at the stage grating to create a (+1, +1) first measurement beam and a (−1, −1) first measurement beam. In some such embodiments, the encoder head includes a first plate, wherein the (+1, +1) first measurement beam and the (−1, −1) first measurement beam are directed through the first plate to rotate a polarization state of each of the (+1, +1) first measurement beam and the (−1, −1) first measurement beam. Additionally, the encoder head can further include a first polarization beam splitter and a second polarization beam splitter that are coupled to the first plate. In some embodiments, the first plate can rotate the polarization state of the (+1, +1) first measurement beam to line up with the first polarization beam splitter; and the first plate can rotate the polarization of the (−1, −1) first measurement beam to line up with the second polarization beam splitter. Further, in one such embodiment, the first polarization beam splitter can be a non-standard polarization beam splitter that transmits s-polarized light and reflects p-polarized light; and the second polarization beam splitter can be a standard polarization beam splitter that reflects s-polarized light and transmits p-polarized light.

Additionally, in one embodiment, the second measurement beam can also be directed twice at the stage grating to create a (+1, +1) second measurement beam and a (−1, −1) second measurement beam. In such embodiment, the (+1, +1) second measurement beam can be interfered with the (−1, −1) first measurement beam to create a first measurement signal along a first signal axis, and the (−1, −1) second measurement beam can be interfered with the (+1, +1) first measurement beam to create a second measurement signal along a second signal axis.

The present embodiment is further directed toward an exposure apparatus including a stage assembly that positions a work piece, and the measurement system as described above that measures the position of the work piece. Moreover, the present embodiment is also directed toward a process for manufacturing a wafer that includes the steps of providing a substrate, and transferring a mask pattern to the substrate with the exposure apparatus as described above.

Additionally, in one application, the present embodiment is further directed toward a measurement system for measuring the position of a work piece, the measurement system comprising (i) a stage grating coupled to the work piece; and (ii) an encoder head that is positioned near the stage grating; wherein a measurement beam and a reference beam are directed together at the stage grating; and wherein at least a portion of the measurement beam and at least a portion of the reference beam are interfered with one another to create a measurement signal along a signal axis.

Further, in another application, the present embodiment is directed toward a method for measuring the position of a work piece, the method comprising the steps of (i) coupling a stage grating to the work piece; (ii) directing a first measurement beam at the stage grating at a first angle, the first measurement beam being at a first wavelength; (iii) directing a second measurement beam at the stage grating at a second angle, the second angle being different than the first angle, and the second measurement beam being at a second wavelength that is different than the first wavelength; and (iv) interfering at least a portion of the first measurement beam and at least a portion of the second measurement beam with one another to create a measurement signal along a signal axis.

In certain embodiments, the measurement system measures relative movement between a first member and a second member, the second member being movable relative to the first member at least in a first direction. In such embodiments, the measurement system comprises a reflective-type diffraction grating provided on one of the first member and the second member, the reflective-type diffraction grating having a grating pattern having a periodic direction in at least the first direction; and an encoder head which is provided on the other of the first member and the second member. The encoder head (i) directs a measurement beam to a first position on the grating pattern of the reflective-type diffraction grating; (ii) redirects a first diffraction beam which is generated via diffraction of the measurement beam from the diffraction grating in relation to the first direction to a second position on the grating pattern of the reflective-type diffraction grating, and (iii) redirects a second diffraction beam, of which order is different from that of the first diffraction beam and which is generated via diffraction of the measurement beam from the diffraction grating in relation to the first direction to a third position on the grating pattern of the reflective-type diffraction grating. A first plane including the first position and beam propagating paths of the first diffracted beam and the second diffracted beam is arranged between the second and third positions.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
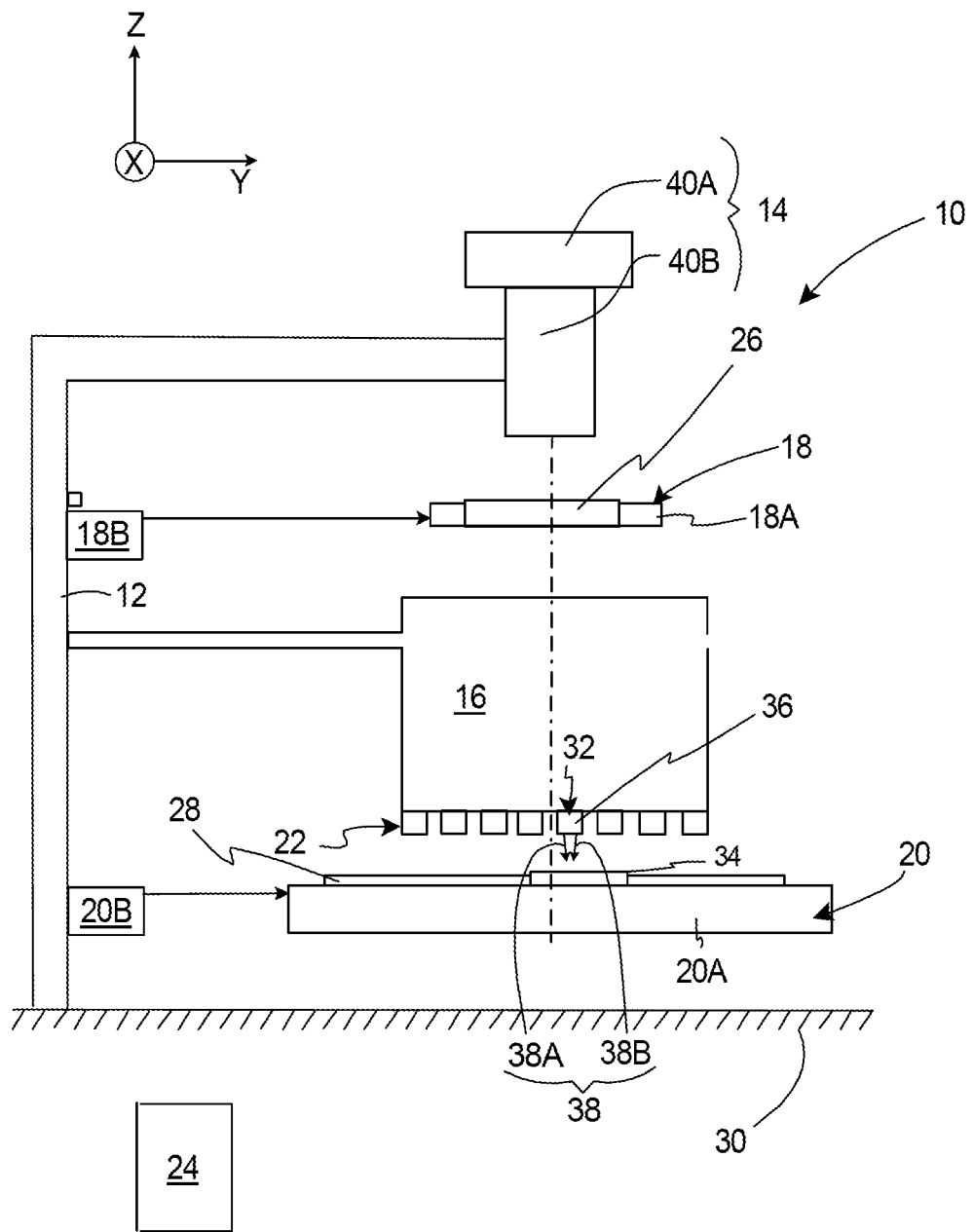
FIG. 1 is a schematic illustration of an exposure apparatus including a measurement system having features of the present embodiment.

FIG. 1 is a schematic illustration of a precision assembly, namely an exposure apparatus 10 having features of the present embodiment. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10.

A number of Figures include an orientation system that illustrates an X axis, a Y axis that is orthogonal to the X axis, and a Z axis that is orthogonal to the X and Y axes. It should be noted that any of these axes can also be referred to as the first, second, and/or third axes.

The exposure apparatus 10 is particularly useful as a lithographic device that transfers a pattern (not shown) of an integrated circuit from a reticle 26 onto a semiconductor wafer 28. The exposure apparatus 10 mounts to a mounting base 30, e.g., the ground, a base, or floor or some other supporting structure.

As an overview, the measurement system 22 includes an encoder assembly 32 that measures the position of a work piece, e.g., the wafer 28, with improved accuracy. For example, in some embodiments, the encoder assembly 32 can be designed to measure and/or monitor the position of the work piece 28 along two axes (e.g., along the X and Y axes). Additionally and/or alternatively, in one embodiment, the encoder assembly 32 can be designed to measure and/or monitor the position of the work piece 28 along all three axes (i.e. along the X, Y and Z axes). Further, the unique encoder assembly 32 as illustrated and described herein provides the desired improved accuracy, while still enabling a relatively small package size, simple construction with a relatively small number of parts, and improved sensitivity.

In FIG. 1, the encoder assembly 32 includes a stage grating 34 that is secured to a stage, e.g., a wafer stage 20A, that retains the work piece 28, and one or more fixed encoder heads 36 that monitor the position of the work piece 28. In one embodiment, the stage grating 34 can be secured to a top of the stage 20A that retains the work piece 28.

Further, one or more pairs of measurement beams 38 (only one pair of measurement beams is illustrated in FIG. 1) are directed toward the stage 20A and/or toward the stage grating 34 that is secured to the stage 20A. For example, each encoder head 36 can direct and/or guide the one or more pairs of measurement beams 38 toward the stage 20A and/or toward the stage grating 34 that is secured to the stage 20A. Additionally, each pair of measurement beams 38, i.e. a first measurement beam 38A and a second measurement beam 38B, can be directed together (i.e. at least approximately, if not precisely, at the same time) toward the stage 20A and/or toward the stage grating 34 that is secured to the stage 20A. It should be noted that the pair of measurement beams 38A, 38B can also be referred to as an input beam. Movement and/or positioning of the stage 20A and/or the stage grating 34 is detected based on the phase of the resulting signals from the measurement beams 38 impinging on the stage grating 34. More particularly, in certain embodiments, movement of the stage 20A and/or the stage grating 34 is determined by changes in the phase of the resulting signals as the beams hit the stage grating 34 at different angles, and not by any changes in path length.

It should be noted that in FIG. 1, the first measurement beam 38A and the second measurement beam 38B are spaced apart for purposes of clarity; and during use of the encoder assembly 32, as provided herein, the first measurement beam 38A and the second measurement beam 38B would be directed toward the stage 20A and/or the stage grating 34 in much closer proximity to one another. More particularly, the measurement beams 38A, 38B can be incident at the same location of the stage grating 34 or at slightly different locations of the stage grating 34.

Additionally, it should be noted that one of the first measurement beam 38A and the second measurement beam 38B may also be referred to as a "reference beam", such that the pair of measurement beams 38 can be said to include a "measurement beam" and a "reference beam". Further, as utilized herein, a "reference beam" is a beam that is interfered with a measurement beam to generate an output (measurement) signal.

Moreover, it should be noted that one specific embodiment of the encoder head 36 is described in detail herein. However, many other ways are possible to direct and combine the measurement beams 38A, 38B that are diffracted off of the stage grating 34 without deviating from the intended scope and breadth of the present embodiment.

In one non-exclusive embodiment, where the stage grating 34 is secured to the top of the stage 20A, the encoder heads 36 are positioned generally above the stage grating 34, and the measurement beams 38 are directed in a generally downward direction toward the stage grating 34 and the stage 20A. Alternatively, the stage grating 34 can be secured to another part of the stage 20A, the encoder heads 36 can be positioned in a different manner relative to the stage grating 34, and/or the measurement beams 38 can be directed toward the stage grating 34 and the stage 20A in a different manner.

In the embodiment illustrated in FIG. 1, each encoder head 36 can be used to monitor the position of the work piece 28 along two axes (i.e. along the X and Y axes) when the stage grating 34 is positioned substantially directly below (or above) it. Thus, as the stage 20A and the stage grating 34 are moved relative to the encoder heads 36, the encoder head(s) 36 positioned substantially directly above (or below) the stage grating 34 will be used to monitor the position of the stage 20A and/or the stage grating 34.

The number of encoder heads 36 can be varied according to the design of the exposure apparatus 10 and/or the measurement system 22, and the amount of travel of the stage 20A. It should be noted that the eight encoder heads 36 illustrated in FIG. 1 is just an example, and the actual number of encoder heads 36 can be greater than or fewer than eight. For example, the encoder assembly 32 can include fourteen encoder heads 36 mounted in a line to measure a large distance of the stage along the Y axis and/or along the X axis. Additionally, it should be noted that the use of multiple encoder heads 36 enables the encoder assembly 32 to more accurately measure the position of the stage 20A and/or the stage grating 34, and thus the position of the work piece 28 that is retained by the stage 20A, due to the stage 20A and the stage grating 34 moving relative to the encoder heads 36. As provided herein, in certain embodiments, to effectively switch between encoder heads 36, the footprint of the measurement beams 38 needs to be small.

Moreover, as provided herein, in certain embodiments, the encoder assembly 32 enables such features as: (i) improved sensitivity; (ii) improved light efficiency; (iii) a small number of components, such that the components should be easy to align; (iv) inhibiting of cyclic non-linear error (CNLE), or stray light rejection; (v) minimal non-common beam path; (vi) minimal number of output fibers; and (vii) manageable assembly size and complexity. As a result thereof, the wafer 28 can be positioned with improved accuracy, and the exposure apparatus 10 can be used to manufacture higher density wafers 28.

There are a number of different types of lithographic devices. For example, the exposure apparatus 10 can be used as a scanning type photolithography system that exposes the pattern from the reticle 26 onto the wafer 28 with the reticle 26 and the wafer 28 moving synchronously. Alternatively, the exposure apparatus 10 can be a step-and-repeat type photolithography system that exposes the reticle 26 while the reticle 26 and the wafer 28 are stationary. However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The apparatus frame 12 is rigid and supports the components of the exposure apparatus 10. The apparatus frame 12 illustrated in FIG. 1 supports the reticle stage assembly 18, the optical assembly 16, the wafer stage assembly 20, and the illumination system 14 above the mounting base 30.

The illumination system 14 includes an illumination source 40A and an illumination optical assembly 40B. The illumination source 40A emits a beam (irradiation) of light energy. The illumination optical assembly 40B guides the beam of light energy from the illumination source 40A to the optical assembly 16. The beam of light energy selectively illuminates different portions of the reticle 26 and exposes the wafer 28.

The illumination source 40A can be a g-line source (436 nm), an i-line source (365 nm), a KrF excimer laser (248 nm), an ArF excimer laser (193 nm), a $F_2$ laser (157 nm), or an EUV source (13.5 nm). Alternatively, the illumination source 40A can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 26 to the wafer 28. Depending upon the design of the exposure apparatus 10, the optical assembly 16 can magnify or reduce the image illuminated on the reticle 26. The optical assembly 16 need not be limited to a reduction system. It could also be a 1× or magnification system.

The reticle stage assembly 18 holds and positions the reticle 26 relative to the optical assembly 16 and the wafer 28. In FIG. 1, the reticle stage assembly 18 includes a reticle stage 18A that retains the reticle 26, and a reticle stage mover assembly 18B that positions the reticle stage 18A and the reticle 26. The reticle stage mover assembly 18B can be designed to move the reticle 26 along the X, Y and Z axes, and about the X, Y and Z axes.

Somewhat similarly, the wafer stage assembly 20 holds and positions the wafer 28 with respect to the projected image of the illuminated portions of the reticle 26. In FIG. 1, the wafer stage assembly 20 includes the wafer stage 20A that retains the wafer 28, and a wafer stage mover assembly 20B that positions the wafer stage 20A and the wafer 28. The wafer stage mover assembly 20B can be designed to move the wafer 28 along the X, Y and Z axes, and about the X, Y and Z axes. In this embodiment, the wafer 28 can be scanned while the wafer stage assembly 20 moves the wafer 28 along the Y axis. In FIG. 1, the stage grating 34 is fixedly secured to the top of the wafer stage 20A. Alternatively, as noted above, the stage grating 34 can be secured to a different portion of the wafer stage 20A, e.g., to the bottom of the wafer stage 20A.

The measurement system 22 monitors movement of the reticle 26 and the wafer 28 relative to the optical assembly 16 or some other reference. With this information, the control system 24 can control the reticle stage assembly 18 to precisely position the reticle 26 and the wafer stage assembly 20 to precisely position the wafer 28. For example, the measurement system 22 can utilize multiple laser interferometers, encoders, autofocus systems, and/or other measuring devices in addition to the encoder assembly 32.

The control system 24 is connected to the reticle stage assembly 18, the wafer stage assembly 20, and the measurement system 22. The control system 24 receives information from the measurement system 22 and controls the stage assemblies 18, 20 to precisely position the reticle 26 and the wafer 28. The control system 24 can include one or more processors and circuits.

Figure 2A:
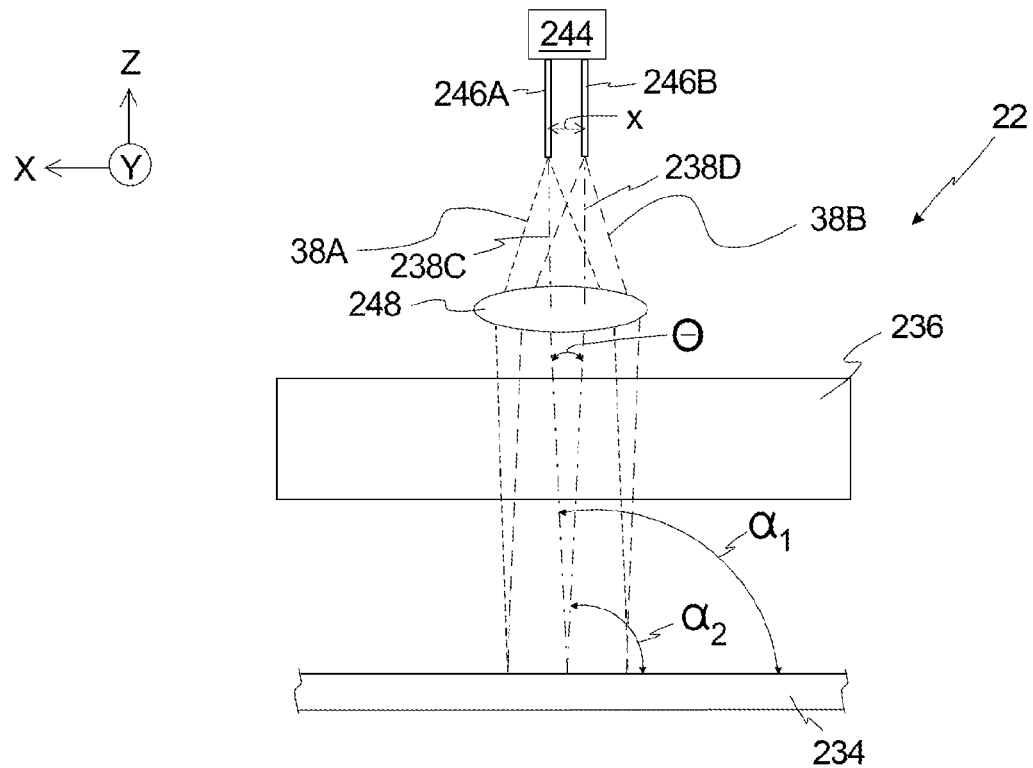
FIG. 2A is a simplified illustration of a portion of the measurement system of FIG. 1 including an embodiment of a beam source that generates a pair of measurement beams usable with the present embodiment.

FIG. 2A is a simplified illustration of a portion of the measurement system 22 of FIG. 1 including an embodiment of a beam source 244 that generates a pair of measurement beams, e.g., the first measurement beam 38A and the second measurement beam 38B, usable with the present embodiment. Additionally, a portion of a stage grating 234 and an encoder head 236 (illustrated as a box) of the measurement system 22 are also illustrated in FIG. 2A.

More specifically, FIG. 2A illustrates that the beam source 244 provides (i) the first measurement beam 38A that is launched via a first input fiber 246A, and (ii) the second measurement beam 38B that is launched via a second input fiber 246B. A center 238C of the first measurement beam 38A and a center 238D of the second measurement beam 38D are also illustrated. In FIG. 2A, the center of the first input fiber 246A is spaced apart from the center of the second input fiber 246B by a fiber spacing, x. Further, the first measurement beam 38A is launched in substantially the same direction (e.g., along the Z axis) and is spaced apart from the second measurement beam 38B.

Additionally, in certain embodiments, the first measurement beam 38A is at a first wavelength $\lambda_1$, and the second measurement beam 38B is at the second wavelength $\lambda_2$ that is different from the first wavelength $\lambda_1$. The difference in wavelength between the first measurement beam 38A and the second measurement beam 38B can vary. As non-exclusive examples, the difference in wavelength between the first measurement beam 38A and the second measurement beam 38B can be a result of a difference in frequency between the first measurement beam 38A and the second measurement beam 38B. For example, in certain non-exclusive embodiments, the difference in frequency between the first measurement beam 38A and the second measurement beam 38B can be approximately 1, 2, 5, 10, 15, 20, 25, 30, 35, or 40 MHz. Stated in another fashion, in alternative, non-exclusive embodiments, the difference between the first wavelength $\lambda_1$, the second wavelength $\lambda_2$ is at least approximately 1.33 femtometers, 6.67 femtometers, 26.7 femtometers, or 53.4 femtometers. As a non-exclusive example, the first wavelength $\lambda_1$ can be approximately 632.8 nm, and the second wavelength $\lambda_2$ can be approximately 632.8 nm+20 MHz+26.7 femtometers.

Moreover, in some embodiments, the first measurement beam 38A can have a first polarization, and the second measurement beam 38B can have a second polarization that is different than the first polarization. For example, in one embodiment, the first measurement beam 38A can include s-polarized light and the second measurement beam 38B can include p-polarized light. Alternatively, the first measurement beam 38A can include p-polarized light and the second measurement beam 38B can include s-polarized light. The different polarizations can assist in the separation of the beams in the encoder head.

As illustrated, in one embodiment, each of the first measurement beam 38A and the second measurement beam 38B is directed through an optical element 248, e.g., a collimating lens. The optical element collimates the measurement beams 38A, 38B and directs the measurement beams 38A, 38B toward the stage grating 234. The optical element 248 can have a focal length, f.

Additionally, in one embodiment, as shown in FIG. 2A, the first measurement beam 38A and the second measurement beam 38B can be directed through the encoder head 236 and at the stage grating 234. Stated in another fashion, in one such embodiment, the encoder head 236 directs and/or guides the measurement beams 38A, 38B, e.g., through one or more apertures (not illustrated) in the encoder head 236, at the stage grating 234. Alternatively, the measurement beams 38A, 38B can be directed at the stage grating 234 in a different manner than that specifically shown in FIG. 2A. For example, one or more mirrors (not illustrated) can be sued to direct the measurement beams 38A, 38B at the stage grating 234.

It should be noted that in addition to each of the measurement beams 38A, 38B being at a different wavelength, the measurement beams 38A, 38B can also be directed such that they impinge on the stage grating 234 at different angles. More specifically, in FIG. 2A, the center 238C of the first measurement beam 38A impinges on the stage grating 234 at a first angle $\alpha_1$ and the center 238D of the second measurement beam 38B impinges on the stage grating 234 at a second angle $\alpha_2$. As illustrated in FIG. 2A, the first angle $\alpha_1$ and the second angle $\alpha_2$ are different from one another by an angle difference, $\Theta$. In the simplified example illustrated in FIG. 2A, the angle difference, $\Theta$, can be calculated based on the fiber spacing, x, between the first input fiber 246A and the second input fiber 246B, and the focal length, f, of the optical element 248. In particular, the angle difference, $\Theta$, between the measurement beams 38A, 38B can be shown, in the small angle approximation, as: $\Theta = x/f$. The angle difference, $\Theta$, between the measurement beams 38A, 38B, can be quite small. For example, in certain embodiments, the beam source 244 can be designed to provide the measurement beams 38A, 38B such that the angle difference, $\Theta$, is between approximately 0.05 degrees and 0.5 degrees. Alternatively, the beam source 244 can be designed to provide the measurement beams 38A, 38B such that the angle difference, $\Theta$, is greater than 0.5 degrees or less than 0.05 degrees.

Further, in certain embodiments, the measurement beams 38A, 38B impinge on the stage grating 234 at approximately, if not precisely, the same location. Alternatively, the measurement beams 38A, 38B can impinge on the stage grating 234 at slightly different locations.

In summary, in FIG. 2A, the beam source 244 generates (i) the first measurement beam 38A at the first polarization and at the first wavelength $\lambda_1$ that impinges on the stage grating 234 at the first angle $\alpha_1$; and (ii) the second measurement beam 38B at the second polarization and at the second wavelength $\lambda_2$ that impinges on the stage grating 234 at the second angle $\alpha_2$ that is different than the first angle $\alpha_1$.

It should be noted that the small angle difference, $\Theta$, between the measurement beams 38A, 38B is used in certain embodiments so that, after two passes (i.e. after the beams are directed twice at the stage grating 234), the proper beams can be selected out and made parallel without getting unwanted light from the other diffracted beams. Moreover, unwanted polarization leakage can be inhibited, which may otherwise adversely influence the output measurement signal.

Figure 2B:
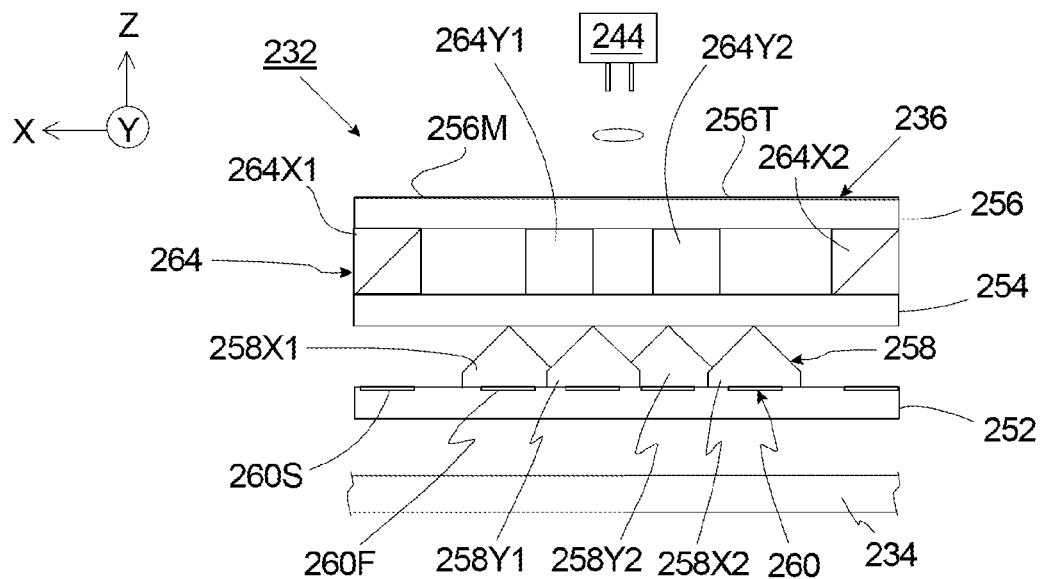
FIG. 2B is a simplified schematic illustration of an embodiment of an encoder assembly, the encoder assembly including a stage grating and an encoder head.

FIG. 2B is a simplified schematic illustration of one, non-exclusive embodiment of an encoder assembly 232 having features of the present embodiment. The design of the encoder assembly 232 can be varied to suit the specific design requirements of the measurement system 22 (illustrated in FIG. 1) and/or the exposure apparatus 10 (illustrated in FIG. 1). In the embodiment illustrated in FIG. 2A, the encoder assembly 232 includes the stage grating 234, the encoder head 236, and the beam source 244 that generates the first measurement beam 38A (not illustrated in FIG. 2B for purposes of clarity) and the second measurement beam 38B (not illustrated in FIG. 2B for purposes of clarity).

As described in detail herein, in certain embodiments, the stage grating 234 acts somewhat like a beam splitter such that a beam that impinges on the stage grating 234 creates one or more diffracted beams that are directed back at the encoder head 236. In one embodiment, the stage grating 234 is a two-dimensional grating that includes two sets of parallel lines (not shown) that run substantially perpendicular to one another in a checkerboard-like manner on a plate that is attached to the stage, e.g., the wafer stage 20A (illustrated in FIG. 1). Alternatively, the stage grating 234 can have a different design. For example, in one embodiment, the stage grating 234 can be a one-dimensional grating (a grating with parallel lines running in one direction). Additionally, in one non-exclusive embodiment, the stage grating 234 has a period of approximately one or two microns.

The design of the encoder head 236 can be varied. In the embodiment illustrated in FIG. 2B, the encoder head 236 includes a first plate 252, a second plate 254, and a third plate 256. Alternatively, the encoder head 236 can have a different design. It should be noted that in certain embodiments, the plates 252, 254, 256 are fixedly coupled together. Further, it should be noted that the use of the terms "first plate", "second plate" and "third plate" is merely for ease of discussion, and any of the plates 252, 254, 256 can be referred to as the "first plate", the "second plate" and/or the "third plate".

As illustrated, the first plate 252 is positioned closest to the stage grating 234. In this embodiment, the first plate 252 is a transparent substrate, e.g., a glass plate, that supports a plurality of redirectors 258 and a plurality of beam adjusters 260. In one embodiment, each of the redirectors 258 can be a corner cube having a diameter of approximately six millimeters. Alternatively, the redirectors 258 can have a different design, and/or the redirectors 258 can have a diameter that is greater than or less than six millimeters. Additionally, in certain embodiments, each of the beam adjusters 260 can be a blazed grating. For example, in one such embodiment, each beam adjuster 260 can be a blazed grating having a pitch of approximately one micron. Alternatively, the beam adjusters 260 can have a different design and/or the beam adjusters 260 can have a pitch other than approximately one micron.

As illustrated, the plurality of redirectors 258 are secured to the first plate 252, e.g., mounted to the top of the first plate 252. As provided herein, the redirectors 258, e.g., corner cubes, are used to remove sensitivity to tip and tilt. Additionally, as shown in this embodiment, the plurality of redirectors 258 can include a first X redirector 258X1, a second X redirector 258X2, a first Y redirector 258Y1, and a second Y redirector 258Y2. Alternatively, the encoder head 236 can include greater than or less than the four redirectors 258 specifically illustrated in FIG. 2B.

Additionally, the beam adjusters 260 can be secured to or etched directly into the first plate 252. As provided herein, the beam adjusters 260 are utilized for correcting the diffraction angle of the diffracted beams that have been created by impinging on the stage grating 234. Further, the beam adjusters 260 can also be utilized to inhibit shearing. Moreover, as illustrated in this embodiment, for each redirector 258 there is a corresponding first beam adjuster 260F that is positioned substantially adjacent to the redirector 258, and a second beam adjuster 260S (only two are illustrated in FIG. 2B for purposes of clarity) that is spaced apart along the first plate 252 from the redirector 258.

It should be noted that the X redirectors 258X1, 258X2 (and the corresponding beam adjusters 260F, 260S) are rotated relative to one another about the Z axis such that the X redirectors 258X1, 258X2 (and the corresponding beam adjusters 260F, 260S) are not aligned with one another along the X axis. Somewhat similarly, it should be noted that, as illustrated in FIG. 2B, the Y redirectors 258Y1, 258Y2 (and the corresponding beam adjusters 260F, 260S) are rotated relative to one another about the Z axis such that the Y redirectors 258Y1, 258Y2 (and the corresponding beam adjusters 260F, 260S) are not aligned with one another along the Y axis.

As shown in the embodiment illustrated in FIG. 2B, the second plate 254 is positioned spaced apart from and substantially between the first plate 252 and the third plate 256. In one embodiment, the second plate 254 is a polarization adjuster (e.g. a half-wave plate "HWP") that rotates the polarization state of the beams that are directed through the second plate 254. Additionally, the polarization state of such beams can be rotated so as to line up with one or more polarization beam splitters 264 ("PBS") that are secured between the second plate 254 and the third plate 256. For example, in one embodiment, the second plate 254, i.e. the HWP, includes a fast axis that can be rotated approximately eight degrees relative to the X axis. Alternatively, the fast axis of the second plate 254, i.e. the HWP, can be rotated by less than or greater than approximately eight degrees relative to the X axis.

As illustrated in this embodiment, the encoder head 236 also includes four spaced apart, polarization beam splitters 264 that are secured between the second plate 254 and the third plate 256. More specifically, the encoder head includes a first X polarization beam splitter 264X1, a second X polarization beam splitter 264X2, a first Y polarization beam splitter 264Y1, and a second Y polarization beam splitter 264Y2. Additionally, in one embodiment, the first X polarization beam splitter 264X1 can be a non-standard PBS that transmits s-polarized light and reflects p-polarized light, and the second X polarization beam splitter 264X2 can be a standard PBS that reflects s-polarized light and transmits p-polarized light. Alternatively, in one embodiment, instead of the first X polarization beam splitter 264X1, i.e. the non-standard PBS, additional half-wave plates can be used. Somewhat similarly, in one embodiment, the first Y polarization beam splitter 264Y1 can be a non-standard PBS that transmits s-polarized light and reflects p-polarized light, and the second Y polarization beam splitter 264Y2 can be a standard PBS that reflects s-polarized light and transmits p-polarized light. Alternatively, in one embodiment, instead of the first Y polarization beam splitter 264Y1, i.e. the non-standard PBS, additional half-wave plates can be used.

Further, as illustrated, the third plate 256 is positioned further away from the stage grating 234 than either of the first plate 252 or the second plate 254. In one embodiment, the third plate 256 is a quarter-wave plate (QWP), which includes a mirror 256M on a top surface 256T. Additionally, the third plate 256 can rotate the polarization state of any beams that traverse it by approximately ninety degrees so they reflect off of the polarization beam splitters 264 on their second pass, i.e. after any such beam is reflected off of the mirror 256M.

It should be noted that the X polarization beam splitters 264X1, 264X2 are rotated relative to one another about the Z axis such that the X polarization beam splitters 264X1, 264X2 are not aligned with one another along the X axis. Additionally, in some embodiments, the X polarization beam splitters 264X1, 264X2 can be rotated relative to one another about the Z axis such that the sides of the X polarization beam splitters 264X1, 264X2 are substantially parallel to one another. Somewhat similarly, it should be noted that, as illustrated in FIG. 2B, the Y polarization beam splitters 264Y1, 264Y2 are rotated relative to one another about the Z axis such that the Y polarization beam splitters 264Y1, 264Y2 are not aligned with one another along the Y axis. Additionally, in some embodiments, the Y polarization beam splitters 264Y1, 264Y2 can be rotated relative to one another about the Z axis such that the sides of the Y polarization beam splitters 264Y1, 264Y2 are substantially parallel to one another.

Figure 3A:
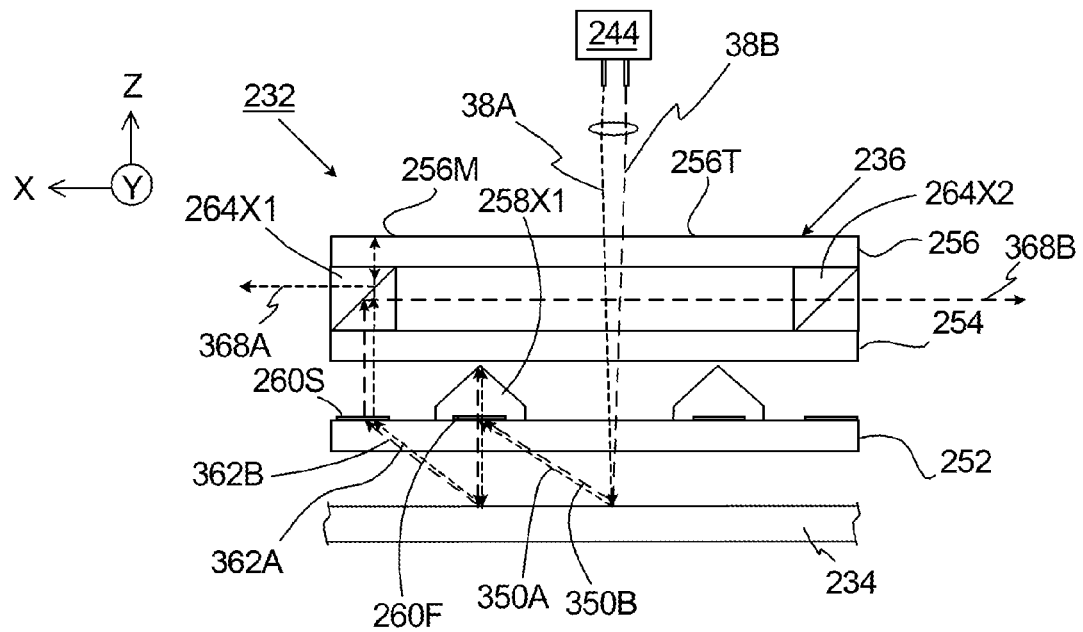
FIG. 3A is a simplified schematic illustration of the encoder assembly illustrated in FIG. 2B, and the directing of a portion of the pair of measurement beams.

FIG. 3A is a simplified schematic illustration of the encoder assembly 232 illustrated in FIG. 2B, and the directing of a portion of the first measurement beam 38A and the second measurement beam 38B. It should be noted that the Y redirectors 258Y1, 258Y2, the corresponding beam adjusters 260F, 260S, and the Y polarization beam splitters 264Y1, 264Y2 have been omitted in FIG. 3A for purposes of clarity.

Initially, the first measurement beam 38A and the second measurement beam 38B that are generated by the beam source 244 are directed and/or guided toward the stage grating 234. As noted above, in certain embodiments, the stage grating 234 acts somewhat like a beam splitter that creates one or more diffracted beams that are directed back at the encoder head 236. For example, in an embodiment where the stage grating 234 is a two-dimensional grating, the first measurement beam 38A impinging on the stage grating 234 creates four primary diffraction orders: (i) a +1 order first X measurement beam 350A, (ii) a −1 order first X measurement beam 366A (illustrated in FIG. 3B), (iii) a +1 order first Y measurement beam 472A (illustrated in FIG. 4A), and (iv) a −1 order first Y measurement beam 474A (illustrated in FIG. 4A). Somewhat similarly, in such embodiment, the second measurement beam 38B impinging on the stage grating 234 creates four primary diffraction orders: (i) a +1 order second X measurement beam 350B, (ii) a −1 order second X measurement beam 366B (illustrated in FIG. 3B), (iii) a +1 order second Y measurement beam 472B (illustrated in FIG. 4A), and (iv) a −1 order second Y measurement beam 474B (illustrated in FIG. 4A). Thus, when utilizing a two-dimensional stage grating 234, the two measurement beams 38A, 38B impinging on the stage grating 234 create eight first order beams that are directed back at the encoder head 236.

As illustrated in FIG. 3A, when the +1 order first X measurement beam 350A and the +1 order second X measurement beam 350B are directed back at the encoder head 236, they are directed toward the first X redirector 258X1 and the first beam adjuster 260F that is positioned substantially adjacent to the first X redirector 258X1. The first beam adjuster 260F corrects the diffraction angle of each of the +1 order first X measurement beam 350A and the +1 order second X measurement beam 350B that have been created by impinging on the stage grating 234. The first X redirector 258X1 redirects the +1 order first X measurement beam 350A and the +1 order second X measurement beam 350B such that the beams 350A, 350B are oriented in a substantially vertical direction, i.e. effectively removing sensitivity to tip and tilt, before being reflected and/or redirected back at the stage grating 234. Thus, each of the beams 350A, 350B is redirected by the first X redirector 258X1 back at the stage grating 234 for a second pass.

Subsequently, the +1 order first X measurement beam 350A and the +1 order second X measurement beam 350B are again diffracted by the stage grating 234. In particular, when the +1 order first X measurement beam 350A is diffracted by the stage grating 234, a (+1, +1) first X measurement beam 362A is created (as well as other second order beams that are discarded or otherwise not utilized by this example of the encoder assembly 232) that is directed back at the first plate 252 of the encoder head 236. Somewhat similarly, when the +1 order second X measurement beam 350B is diffracted by the stage grating 234, a (+1, +1) second X measurement beam 362B is created (as well as other second order beams that are discarded or otherwise not utilized by this example of the encoder assembly 232) that is directed back at the first plate 252 of the encoder head 236.

As illustrated, when the (+1, +1) first X measurement beam 362A and the (+1, +1) second X measurement beam 362B are directed back at the encoder head 236, they are directed toward one of the second beam adjusters 260S. The second beam adjuster 260S corrects the diffraction angle of each of the (+1, +1) first X measurement beam 362A and the (+1, +1) second X measurement beam 362B that have been created by impinging on the stage grating 234.

Subsequently, the (+1, +1) first X measurement beam 362A and the (+1, +1) second X measurement beam 362B are directed toward and/or through the second plate 254. As noted above, the second plate 254 can be a half-wave plate (HWP) that is rotated in order to rotate the polarization state of the beams, e.g., the (+1, +1) first X measurement beam 362A and the (+1, +1) second X measurement beam 362B.

The (+1, +1) first X measurement beam 362A and the (+1, +1) second X measurement beam 362B are then directed toward the first X polarization beam splitter 264X1, which, as noted above, can be a non-standard PBS that transmits s-polarized light and reflects p-polarized light.

In one embodiment, the (+1, +1) first X measurement beam 362A can include s-polarized light prior to being directed toward the first X polarization beam splitter 264X1, such that the (+1, +1) first X measurement beam 362A is transmitted through the first X polarization beam splitter 264X1 toward the third plate 256. As provided above, the third plate 256 can be a quarter-wave plate (QWP) that can rotate the polarization state of any beams that traverse it twice, as in FIG. 3A, by approximately ninety degrees. For example, the (+1, +1) first X measurement beam 362A that includes s-polarized light can have its polarization state rotated by the third plate 256 by approximately ninety degrees such that the (+1, +1) first X measurement beam 362A now includes p-polarized light. Thus, when the (+1, +1) first X measurement beam 362A is reflected off of the mirror 256M on the top surface 256T of the third plate 256 and back toward the first X polarization beam splitter 264X1, the (+1, +1) first X measurement beam 362A is then reflected off of the first X polarization beam splitter 264X1 such that the (+1, +1) first X measurement beam 362A is redirected to the left (as shown in FIG. 3A) along a first system axis 368A.

Additionally, in such embodiment, the (+1, +1) second X measurement beam 362B can include p-polarized light prior to being directed toward the first X polarization beam splitter 264X1. Thus, the (+1, +1) second X measurement beam 362B is reflected off of the first X polarization beam splitter 264X1 such that the (+1, +1) second X measurement beam 362B is redirected to the right (as shown in FIG. 3A) along a second system axis 368B. Additionally, it should be noted that with the second X polarization beam splitter 264X2 being a standard PBS that transmits p-polarized light and reflects s-polarized light, the (+1, +1) second X measurement beam 362B is shown as being transmitted through the second X polarization beam splitter 264X2.

Figure 3B:
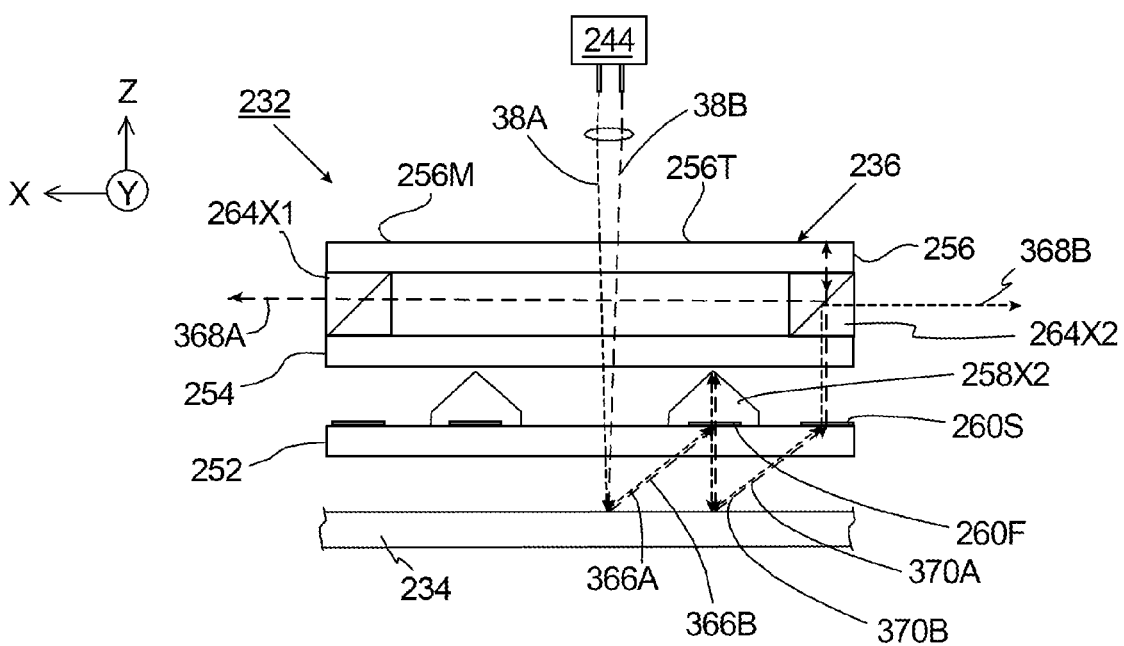
FIG. 3B is a simplified schematic illustration of the encoder assembly illustrated in FIG. 2B, and the directing of another portion of the pair of measurement beams.

FIG. 3B is a simplified schematic illustration of the encoder assembly 232 illustrated in FIG. 2B, and the directing of another portion of the first measurement beam 38A and the second measurement beam 38B. It should be noted that the Y redirectors 258Y1, 258Y2, the corresponding beam adjusters 260F, 260S, and the Y polarization beam splitters 264Y1, 264Y2 have again been omitted in FIG. 3B for purposes of clarity.

In particular, of the four primary diffraction orders created by the first measurement beam 38A impinging on the stage grating 234, FIG. 3B illustrates the directing of the −1 order first X measurement beam 366A as and after the beam 366A is directed back toward the encoder head 236. Somewhat similarly, of the four primary diffraction orders created by the second measurement beam 38B impinging on the stage grating 234, FIG. 3B illustrates the directing of the −1 order second X measurement beam 366B as and after the beam 366B is directed back toward the encoder head 236.

As illustrated in FIG. 3B, when the −1 order first X measurement beam 366A and the −1 order second X measurement beam 366B are directed back at the encoder head 236, they are directed toward the second X redirector 258X2 and the first beam adjuster 260F that is positioned substantially adjacent to the second X redirector 258X2. The first beam adjuster 260F corrects the diffraction angle of each of the −1 order first X measurement beam 366A and the −1 order second X measurement beam 366B that have been created by impinging on the stage grating 234. The second X redirector 258X2 redirects the −1 order first X measurement beam 366A and the −1 order second X measurement beam 366B such that the beams 366A, 366B are oriented in a substantially vertical direction, before being reflected and/or redirected back at the stage grating 234. Thus, each of the beams 366A, 366B is redirected by the second X redirector 258X2 back at the stage grating 234 for a second pass.

Subsequently, the −1 order first X measurement beam 366A and the −1 order second X measurement beam 366B are again diffracted by the stage grating 234. In particular, when the −1 order first X measurement beam 366A is diffracted by the stage grating 234, a (−1, −1) first X measurement beam 370A is created (as well as other second order beams that are discarded or otherwise not utilized by this example of the encoder assembly 232) that is directed back at the first plate 252 of the encoder head 236. Somewhat similarly, when the −1 order second X measurement beam 366B is diffracted by the stage grating 234, a (−1, −1) second X measurement beam 370B is created (as well as other second order beams that are discarded or otherwise not utilized by this example of the encoder assembly 232) that is directed back at the first plate 252 of the encoder head 236.

As illustrated, when the (−1, −1) first X measurement beam 370A and the (−1, −1) second X measurement beam 370B are directed back at the encoder head 236, they are directed toward one of the second beam adjusters 260S. The second beam adjuster 260S corrects the diffraction angle of each of the (−1, −1) first X measurement beam 370A and the (−1, −1) second X measurement beam 370B that have been created by impinging on the stage grating 234.

Subsequently, the (−1, −1) first X measurement beam 370A and the (−1, −1) second X measurement beam 370B are directed toward and/or through the second plate 254, which, as noted above, is rotated in order to rotate the polarization state of the beams, e.g., the (−1, −1) first X measurement beam 370A and the (−1, −1) second X measurement beam 370B.

The (−1, −1) first X measurement beam 370A and the (−1, −1) second X measurement beam 370B are then directed toward the second X polarization beam splitter 264X2, which, as noted above, can be a standard PBS that transmits p-polarized light and reflects s-polarized light.

In one embodiment, the (−1, −1) first X measurement beam 370A can include s-polarized light prior to being directed toward the second X polarization beam splitter 264X2. Thus, the (−1, −1) first X measurement beam 370A is reflected off of the second X polarization beam splitter 264X2 such that the (−1, −1) first X measurement beam 370A is redirected to the right (as shown in FIG. 3B) along the second system axis 368S.

Additionally, in such embodiment, the (−1, −1) second X measurement beam 370B can include p-polarized light prior to being directed toward the second X polarization beam splitter 264X2, such that the (−1, −1) second X measurement beam 370B is transmitted through the second X polarization beam splitter 264X2 toward the third plate 256. As provided above, the third plate 256 can be a quarter-wave plate (QWP) that can rotate the polarization state of any beams that traverse it by approximately ninety degrees. For example, the (−1, −1) second X measurement beam 370B that includes p-polarized light can have its polarization state rotated by two passes through the third plate 256 by approximately ninety degrees such that the (−1, −1) second X measurement beam 370B now includes s-polarized light. Thus, when the (−1, −1) second X measurement beam 370B is reflected off of the mirror 256M on the top surface 256T of the third plate 256 and back toward the second X polarization beam splitter 264X2, the (−1, −1) second X measurement beam 370B is then reflected off of the second X polarization beam splitter 264X2 such that the (−1, −1) second X measurement beam 370B is redirected to the left (as shown in FIG. 3B) along the first system axis 368F. Further, it should be noted that with the first X polarization beam splitter 264X1 being a non-standard PBS that transmits s-polarized light and reflects p-polarized light, the (−1, −1) second X measurement beam 370B is shown as being transmitted through the first X polarization beam splitter 264X1.

Figure 3C:
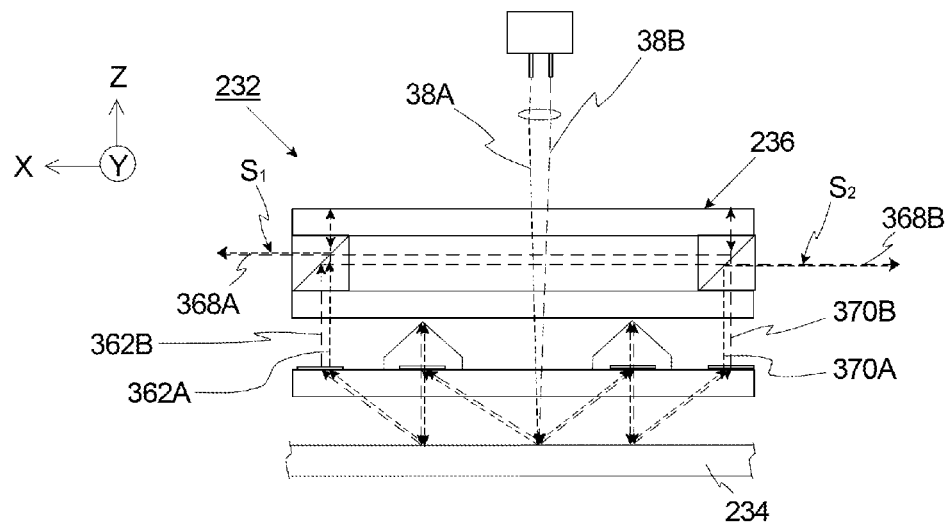
FIG. 3C is a simplified schematic illustration of the encoder assembly illustrated in FIG. 2B, and the combined directing of the portions of the pair of measurement beams as illustrated in FIGS. 3A and 3B.

FIG. 3C is a simplified schematic illustration of the encoder assembly 232, i.e. the stage grating 234 and the encoder head 236, illustrated in FIG. 2B, and the combined directing of the portions of the first measurement beam 38A and the second measurement beam 38B as illustrated in FIGS. 3A and 3B, respectively. It should be noted that the Y redirectors 258Y1, 258Y2, the corresponding beam adjusters 260F, 260S, and the Y polarization beam splitters 264Y1, 264Y2 have again been omitted in FIG. 3C for purposes of clarity.

In particular, FIG. 3C illustrates the combining and/or interfering of the (+1, +1) first X measurement beam 362A and the (−1, −1) second X measurement beam 370B to the left (as shown in FIG. 3C) as a first output signal, $S_1$, along the first system axis 368A. Somewhat similarly, FIG. 3C further illustrates the combining and/or interfering of the (+1, +1) second X measurement beam 362B and the (−1, −1) first X measurement beam 370A to the right (as shown in FIG. 3C) as a second output signal, $S_2$, along the second system axis 368B. It should be noted that the two beams 362A, 370B that comprise the first output signal $S_1$ are of orthogonal polarizations and of different wavelengths when they exit to the left along the first system axis 368A, such that the first output signal $S_1$ is a heterodyne interference signal. Insertion of a simple polarizer (not shown) will align the polarization axes of the beams in order to obtain interference. Similarly, it should be noted that the two beams 362B, 370A that comprise the second output signal $S_2$ are of orthogonal polarizations and of different wavelengths when they exit to the right along the second system axis 368B, such that the second output signal $S_2$ is a heterodyne interference signal. Insertion of a simple polarizer (not shown) will again align the polarization axes of the beams in order to obtain interference.

Additionally, it should be noted that with this design, when utilizing the first measurement beam 38A at the first wavelength, $\lambda_1$, neither the (+1, +1) first X measurement beam 362A nor the (−1, −1) first X measurement beam 370A traverse the space between the first X polarization beam splitter 264X1 and the second X polarization beam splitter 264X2. Further, it should be noted that with this design, when utilizing the second measurement beam 38B at the second wavelength, $\lambda_2$, both the (+1, +1) second X measurement beam 362B and the (−1, −1) second X measurement beam 370B traverse the space between the first X polarization beam splitter 264X1 and the second X polarization beam splitter 264X2. Further, it should be noted that the beams 362B, 370B are shown as being offset in the Z direction as the beams 362B, 370B traverse the space between the first X polarization beam splitter 264X1 and the second X polarization beam splitter 264X2 for purposes of clarity.

Moreover, as noted above, in certain embodiments, the small angle difference, $\Theta$, between the measurement beams 38A, 38B is necessary so that, after both passes, the proper beams can be selected out and made parallel without getting unwanted light from the other diffracted beams. For example, during interference of the (+1, +1) first ($\lambda_1$) X measurement beam 362A and the (−1, −1) second ($\lambda_2$) X measurement beam 370B, by tilting the (−1, −1) second X measurement beam 370B to make it parallel to the (+1, +1) first X measurement beam 362A, the other unwanted beams are not parallel to these beams, so they do not cause cyclic non-linear error (CNLE).

Figure 3D:
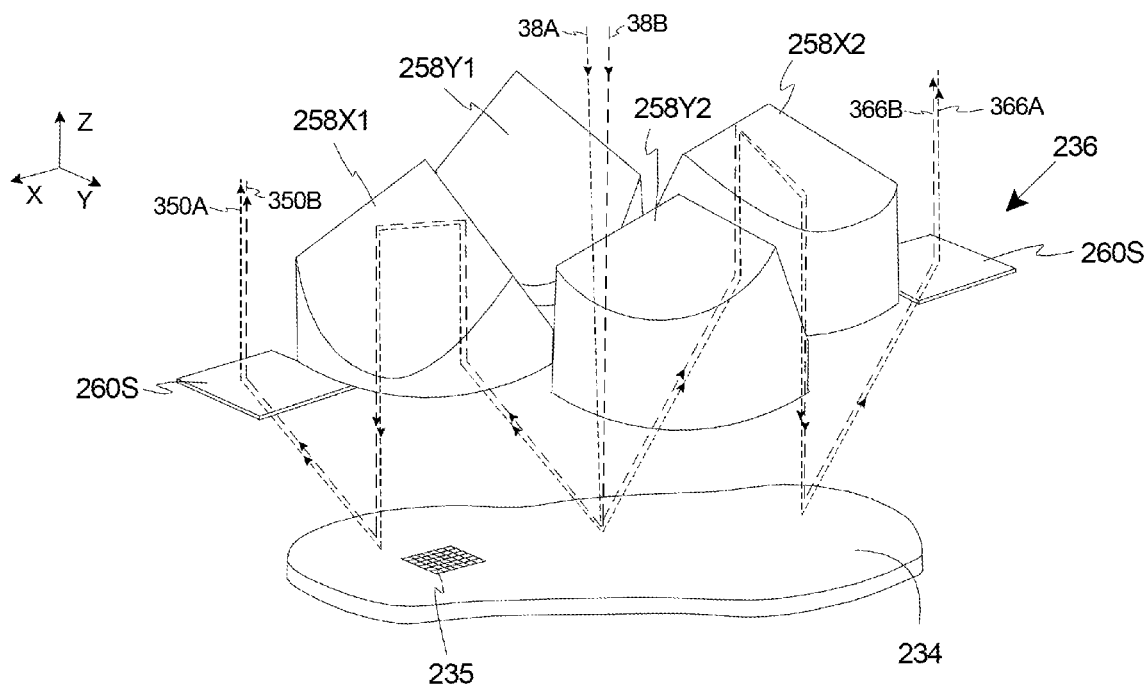
FIG. 3D is a simplified perspective view of a portion of the encoder assembly of FIG. 2B.

FIG. 3D is a simplified illustration of a portion of the encoder head 236 and the grating 234 with a portion of the two dimensional grating lines 235 illustrated for reference. In FIG. 3D, the four redirectors 258X1, 258X2, 258Y1, 258Y2, and the second beam adjusters 260S for the X axis are shown. The other components have been omitted for clarity.

FIG. 3D also illustrates the measurement beams 38A, 38B that are directed at the stage grating 234 to create two sets of four primary diffraction orders. It should be noted that only (i) the +1 order first X measurement beam 350A, (ii) the −1 order first X measurement beam 366A, (iii) the +1 order second X measurement beam 350B, and (ii) the −1 order second X measurement beam 366B are illustrated in FIG. 3D.

In this example, the +1 order first X measurement beam 350A and the +1 order second X measurement beam 350B are directed from the grating 234 to the first X redirector 258X1 (via the first beam adjuster (not shown in FIG. 3D)). The first X redirector 258X1 redirects the +1 order first X measurement beam 350A and the +1 order second X measurement beam 350B back at the stage grating 234. The stage grating 234 diffracts these beams 350A, 350B back upward to the second beam adjuster 260S associated with the first X redirector 258X1.

Similarly, (i) the −1 order first X measurement beam 366A and the −1 order second X measurement beam 366B are directed from the grating 234 to the second X redirector 258X2 (via the first beam adjuster (not shown in FIG. 3D)). The second X redirector 258X2 redirects the −1 order first X measurement beam 366A and the −1 order second X measurement beam 366B back at the stage grating 234. The stage grating 234 diffracts these beams 366A, 366B back upward to the second beam adjuster 260S associated with the second X redirector 258X2.

Figure 4A:
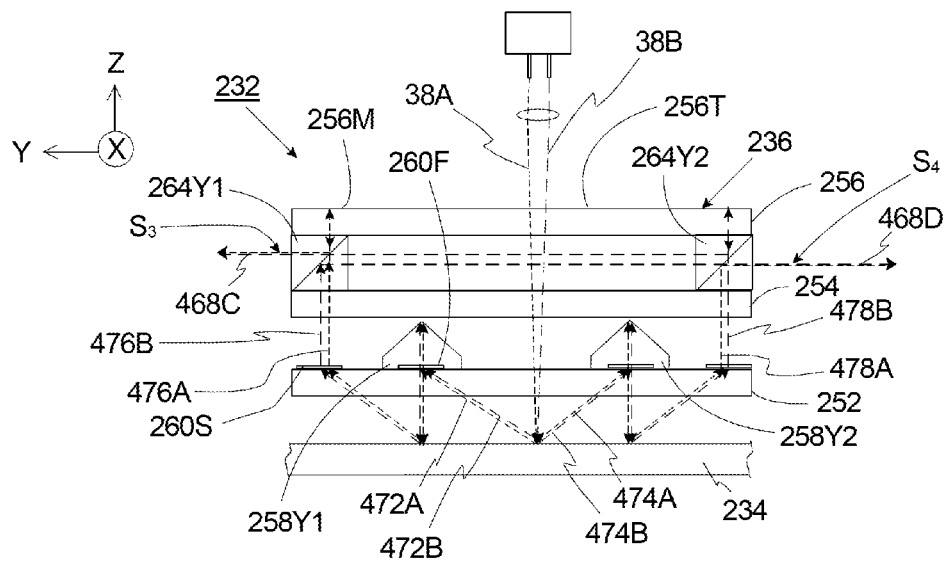
FIG. 4A is a simplified schematic illustration of the encoder assembly illustrated in FIG. 2B, and the combined directing of other portions of the pair of measurement beams.

FIG. 4A is a simplified schematic illustration of the encoder assembly 232 illustrated in FIG. 2B, and the combined directing of other portions of the first measurement beam 38A and the second measurement beam 38B. In particular, FIG. 4A illustrates the various beams that are created and subsequently combined for measurements of the position of the work piece 28 (illustrated in FIG. 1), the stage 20A (illustrated in FIG. 1) and/or the stage grating 234 along the Y axis. It should be noted that the X redirectors 258X1, 258X2, the corresponding beam adjusters 260F, 260S, and the X polarization beam splitters 264X1, 264X2 have been omitted in FIG. 4A for purposes of clarity.

As noted above, in an embodiment where the stage grating 234 is a two-dimensional grating, the first measurement beam 38A impinging on the stage grating 234 creates four primary diffraction orders, including the +1 order first Y measurement beam 472A, and the −1 order first Y measurement beam 474A. Somewhat similarly, in such embodiment, the second measurement beam 38B impinging on the stage grating 234 creates four primary diffraction orders including the +1 order second Y measurement beam 472B, and the −1 order second Y measurement beam 474B.

As illustrated in FIG. 4A, when the +1 order first Y measurement beam 472A and the +1 order second Y measurement beam 472B are directed back at the encoder head 236, they are directed toward the first Y redirector 258Y1 and the first beam adjuster 260F that is positioned substantially adjacent to the first Y redirector 258Y1. Somewhat similarly, when the −1 order first Y measurement beam 474A and the −1 order second Y measurement beam 474B are directed back at the encoder head 236, they are directed toward the second Y redirector 258Y2 and the first beam adjuster 260F that is positioned substantially adjacent to the second Y redirector 258Y2.

The first beam adjuster 260F corrects the diffraction angle of each of the first order Y measurement beams 472A, 472B, 474A, 474B that have been created by impinging on the stage grating 234. The first Y redirector 258Y1 redirects the +1 order first Y measurement beam 472A and the +1 order second Y measurement beam 472B such that the beams 472A, 472B are oriented in a substantially vertical direction before being reflected and/or redirected back at the stage grating 234. Thus, each of the beams 472A, 472B is redirected by the first Y redirector 258Y1 back at the stage grating 234 for a second pass. Somewhat similarly, the second Y redirector 258Y2 redirects the −1 order first Y measurement beam 474A and the −1 order second Y measurement beam 474B such that the beams 474A, 474B are oriented in a substantially vertical direction before being reflected and/or redirected back at the stage grating 234. Thus, each of the beams 474A, 474B is redirected by the second Y redirector 258Y2 back at the stage grating 234 for a second pass.

Subsequently, each of the first order Y measurement beams 472A, 472B, 474A, 474B are again diffracted by the stage grating 234 to create a (+1, +1) first Y measurement beam 476A, a (+1, +1) second Y measurement beam 476B, a (−1, −1) first Y measurement beam 478A, and a (−1, −1) second Y measurement beam 478B, respectively (as well as other second order beams that are discarded or otherwise not utilized by this example of the encoder assembly 232) that are directed back at the first plate 252 of the encoder head 236.

As illustrated, each of the second pass beams 476A, 476B, 478A, 478B are directed toward one of the second beam adjusters 260S to correct the diffraction angle of each of the beams 476A, 476B, 478A, 478B that have been created by impinging on the stage grating 234.

Each of the second pass beams, i.e. the (+1, +1) first Y measurement beam 476A, the (+1, +1) second Y measurement beam 476B, the (−1, −1) first Y measurement beam 478A, and a (−1, −1) second Y measurement beam 478B, are then directed toward and/or through the second plate 254, which, as noted above, is rotated in order to rotate the polarization state of the beams 476A, 476B, 478A, 478B.

The (+1, +1) first Y measurement beam 476A and the (+1, +1) second Y measurement beam 476B are then directed toward the first Y polarization beam splitter 264Y1, which can be a non-standard PBS that transmits s-polarized light and reflects p-polarized light. In one embodiment, the (+1, +1) first Y measurement beam 476A can include s-polarized light prior to being directed toward the first Y polarization beam splitter 264Y1, such that the (+1, +1) first Y measurement beam 476A is transmitted through the first Y polarization beam splitter 264Y1 toward the third plate 256. As provided above, the third plate 256 can be a quarter-wave plate (QWP) that can rotate the polarization state of any beams that traverse it twice by approximately ninety degrees, such that the (+1, +1) first Y measurement beam 476A can now include p-polarized light after engaging the third plate 256. Thus, when the (+1, +1) first Y measurement beam 476A is reflected off of the mirror 256M on the top surface 256T of the third plate 256 and back toward the first Y polarization beam splitter 264Y1, the (+1, +1) first Y measurement beam 476A is then reflected off of the first Y polarization beam splitter 264Y1 such that the (+1, +1) first Y measurement beam 476A is redirected to the left (as shown in FIG. 4) along a third system axis 468C.

Additionally, in such embodiment, the (+1, +1) second Y measurement beam 476B can include p-polarized light prior to being directed toward the first Y polarization beam splitter 264Y1. Thus, the (+1, +1) second Y measurement beam 476B is reflected off of the first Y polarization beam splitter 264Y1 such that the (+1, +1) second Y measurement beam 476B is redirected to the right (as shown in FIG. 4) along a fourth system axis 468D. Additionally, it should be noted that with the second Y polarization beam splitter 264Y2 being a standard PBS that transmits p-polarized light and reflects s-polarized light, the (+1, +1) second Y measurement beam 476B is shown as being transmitted through the second Y polarization beam splitter 264Y2.

Further, the (−1, −1) first Y measurement beam 478A and the (−1, −1) second Y measurement beam 478B are then directed toward the second Y polarization beam splitter 264Y2. In one embodiment, the (−1, −1) first Y measurement beam 478A can include s-polarized light prior to being directed toward the second Y polarization beam splitter 264Y2. Thus, the (−1, −1) first Y measurement beam 478A is reflected off of the second Y polarization beam splitter 264Y2 such that the (−1, −1) first Y measurement beam 478A is redirected to the right (as shown in FIG. 4) along the fourth system axis 468D.

Additionally, the (−1, −1) second Y measurement beam 478B can include p-polarized light prior to being directed toward the second Y polarization beam splitter 264Y2, such that the (−1, −1) second Y measurement beam 478B is transmitted through the second Y polarization beam splitter 264Y2 toward the third plate 256. As provided above, the third plate 256 can be a quarter-wave plate (QWP) that can rotate the polarization state of any beams that traverse it twice by approximately ninety degrees, such that the (−1, −1) second Y measurement beam 478B can now include p-polarized light after engaging the third plate 256. Thus, when the (−1, −1) second Y measurement beam 478B is reflected off of the mirror 256M on the top surface 256T of the third plate 256 and back toward the second Y polarization beam splitter 264Y2, the (−1, −1) second Y measurement beam 478B is then reflected off of the second Y polarization beam splitter 264Y2 such that the (−1, −1) second Y measurement beam 478B is redirected to the left (as shown in FIG. 4A) along the third system axis 468C. Further, it should be noted that with the first Y polarization beam splitter 264Y1 being a non-standard PBS that transmits s-polarized light and reflects p-polarized light, the (−1, −1) second Y measurement beam 478B is shown as being transmitted through the first Y polarization beam splitter 264Y1.

Still further, FIG. 4A further illustrates the combining and/or interfering of the (+1, +1) first Y measurement beam 476A and the (−1, −1) second Y measurement beam 478B to the left (as shown in FIG. 4) as a third output signal, $S_3$, along the third system axis 468C. Somewhat similarly, FIG. 4 also illustrates the combining and/or interfering of the (+1, +1) second Y measurement beam 476B and the (−1, −1) first Y measurement beam 478A to the right (as shown in FIG. 4) as a fourth output signal, $S_4$, along the fourth system axis 468D.

It should be noted, as illustrated in FIGS. 3A-3D and 4A-4B and as described herein, with the first measurement beam 38A and the second measurement beam 38B both being initially directed toward the stage grating 234 as input beams, and with each beam 38A, 38B impinging on approximately the same spot on the stage grating 234, albeit at a different angle, eight total beams will be created from the double pass off the stage grating 234. In particular, the first measurement beam 38A (at a first wavelength $\lambda_1$) will create (i) the (+1, +1) first X measurement beam 362A, (ii) the (−1, −1) first X measurement beam 370A, (iii) the (+1, +1) first Y measurement beam 476A, and (iv) the (−1, −1) first Y measurement beam 478A. Somewhat similarly, the second measurement beam 38B (at a second wavelength $\lambda_2$) will create (i) the (+1, +1) second X measurement beam 362B, (ii) the (−1, −1) second X measurement beam 370B, (iii) the (+1, +1) second Y measurement beam 476B, and (iv) the (−1, −1) second Y measurement beam 478B.

Figure 4B:
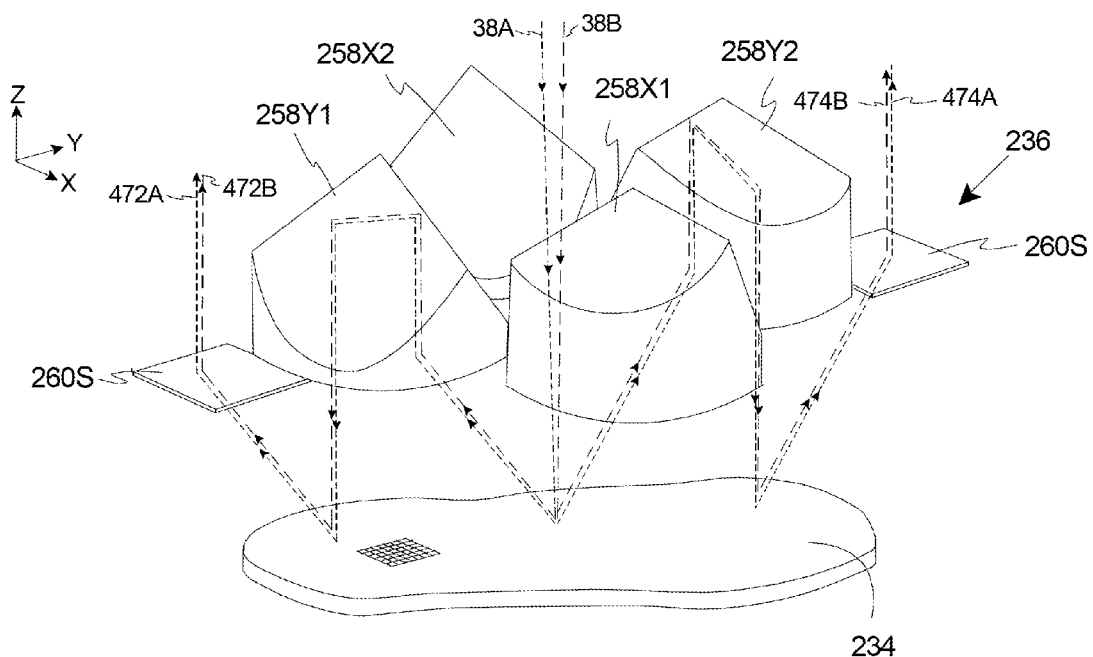
FIG. 4B is a simplified perspective view of a portion of the encoder assembly of FIG. 2B.

FIG. 4B is a simplified illustration of a portion of the encoder head 236 and the grating 234. In FIG. 4B, the four redirectors 258X1, 258X2, 258Y1, 258Y2, and the second beam adjusters 260S for the Y axis are shown. The other components have been omitted for clarity. It should be noted that the view illustrated in FIG. 4B is rotated ninety degrees from the view in FIG. 3D.

FIG. 4B also illustrates the measurement beams 38A, 38B that are directed at the stage grating 234 to create to sets of four primary diffraction orders. It should be noted that only (i) the +1 order first Y measurement beam 472A, (ii) the −1 order first Y measurement beam 474A, (iii) the +1 order second Y measurement beam 472B, and (ii) the −1 order second Y measurement beam 472B are illustrated in FIG. 4B.

In this example, the +1 order first Y measurement beam 472A and the +1 order second Y measurement beam 472B are directed from the grating 234 to the first Y redirector 258Y1 (via the first beam adjuster (not shown in FIG. 4B)). The first Y redirector 258Y1 redirects the +1 order first Y measurement beam 472A and the +1 order second Y measurement beam 472B back at the stage grating 234. The stage grating 234 refracts these beams 472A, 472B back upward to the second beam adjuster 260S associated with the first Y redirector 258Y1.

Similarly, (i) the −1 order first Y measurement beam 474A and the −1 order second Y measurement beam 474B are directed from the grating 234 to the second Y redirector 258Y2 (via the first beam adjuster (not shown in FIG. 4B)). The second Y redirector 258Y2 redirects the −1 order first Y measurement beam 474A and the −1 order second Y measurement beam 474B back at the stage grating 234. The stage grating 234 refracts these beams 474A, 474B back upward to the second beam adjuster 260S associated with the second Y redirector 258Y2.

Figure 5A:
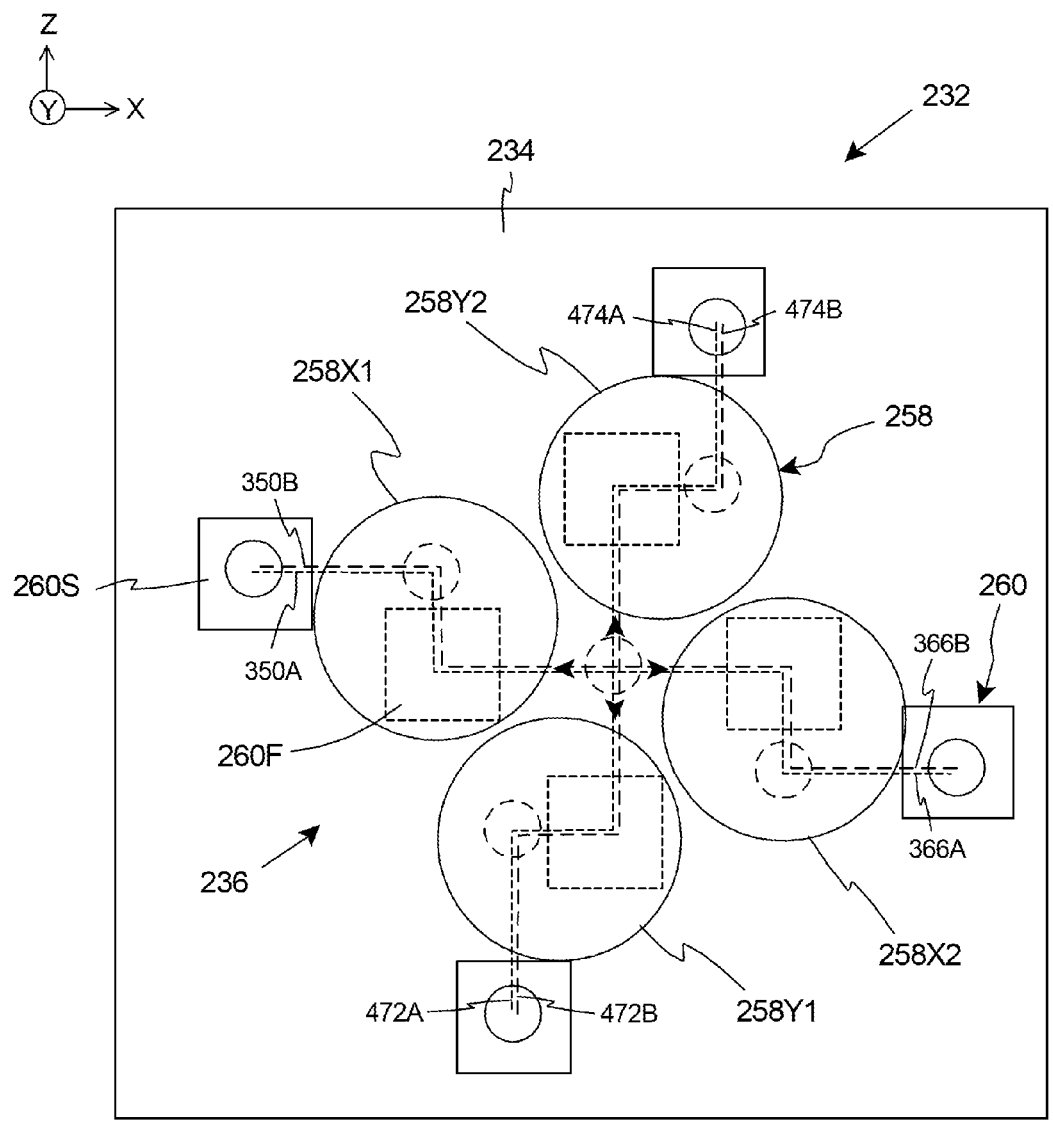
FIG. 5A is a simplified top view of a portion of the encoder assembly illustrated in FIG. 2A.

FIG. 5A is a top view of a portion of the encoder assembly 232 illustrated in FIG. 2B, with the plates 252, 254, 256 omitted for clarity. More specifically, FIG. 5A illustrates a lower portion of the encoder head 236, i.e. the redirectors 258 and the beam adjusters 260, as well as a portion of the stage grating 234.

FIG. 5A illustrates that the measurement beams 38A, 38B (illustrated in FIG. 2A directed at the grating 234 creates (i) the +1 order first X measurement beam 350A, (ii) the −1 order first X measurement beam 366A, (iii) the +1 order first Y measurement beam 472A, (iv) the −1 order first Y measurement beam 474A, (v) the +1 order second X measurement beam 350B, (vi) the −1 order second X measurement beam 366B, (vii) the +1 order second Y measurement beam 472B, and (viii) the −1 order second Y measurement beam 474B.

In FIG. 5A, the dashed circles are utilized to indicate the beam footprint locations on the stage grating 234, with the center dashed circle indicating the initial location of the measurement beams 38A, 38B impinging on the stage grating 234, and the outer dashed circles indicating the locations of the first order diffracted beams (i.e. two first order X diffracted beams and two first order Y diffracted beams) impinging on the stage grating 234 for the second pass. Additionally, the solid circles indicate the output signals (i.e. two X output signals relating to the position of the stage grating 234 in the X direction, and two Y output signals relating to the position of the stage grating 234 in the Y direction) from the second pass diffracted beams that are subsequently combined to interfere. It should be noted that during use of the encoder assembly 232, the location of the grating 234 can be determined by using all four of the output (measurement) signals, or the location of the grating 234 can be determined by using only two output signals, i.e. one X output signal and one Y output signal.

Additionally, as shown in FIG. 5A, the first X redirector 258X1 and the second X redirector 258X2 (and the corresponding beam adjusters 260F (illustrated in phantom), 260S) are rotated relative to one another about the Z axis such that the X redirectors 258X1, 258X2 (and the corresponding beam adjusters 260F, 260S) are not aligned with one another along the X axis. For example, in one non-exclusive embodiment, the first X redirector 258X1 and the second X redirector 258X2 are rotated relative to one another by approximately eight degrees about the Z axis (i.e. relative to precise alignment along the X axis). Alternatively, the first X redirector 258X1 and the second X redirector 258X2 can be rotated relative to one another about the Z axis by greater than or less than approximately eight degrees.

Somewhat similarly, it should be noted that, as illustrated in FIG. 2B, the Y redirectors 258Y1, 258Y2 (and the corresponding beam adjusters 260F, 260S) are rotated relative to one another about the Z axis such that the Y redirectors 258Y1, 258Y2 (and the corresponding beam adjusters 260F, 260S) are not aligned with one another along the Y axis. For example, in one non-exclusive embodiment, the first Y redirector 258Y1 and the second Y redirector 258Y2 are rotated relative to one another by approximately eight degrees about the Z axis (i.e. relative to precise alignment along the Y axis). Alternatively, the first Y redirector 258Y1 and the second Y redirector 258Y2 can be rotated relative to one another about the Z axis by greater than or less than approximately eight degrees.

Figure 5B:
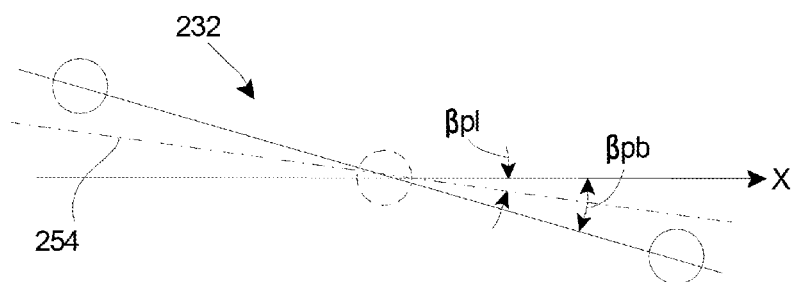
FIG. 5B is a simplified schematic illustration of how another portion of the encoder assembly works.

FIG. 5B is a simplified schematic illustration of how another portion of the encoder assembly 232 works. More specifically, FIG. 5B illustrates the second plate 254, e.g., the half-wave plate (HWP), and its orientation relative to the X axis. Additionally, FIG. 5B further illustrates the orientation of the initial measurement beam footprint location (illustrated with a dashed circle) and the X output beams or output signals (illustrated as solid circles).

In FIG. 5B, the X output beams or output signals include both beam wavelengths ($\lambda_1$ and $\lambda_2$), which are orthogonally polarized. To combine the X output beams with each other would require a lot of fold mirrors, if they are kept parallel to the X axis. Thus, as illustrated in FIG. 5B, in certain embodiments, the new approach is to use the second plate 254 that is rotated at a plate rotation angle $\beta_{pl}$ relative to the X axis, which rotates the polarized beams to a beam rotation angle $\beta_{pb}$ relative to the X axis. For example, in one non-exclusive embodiment, the second plate 254 can be rotated relative to the X axis with the plate rotation angle $\beta_{pl}$ of approximately −8.2 degrees, which will, in turn, result in the beam rotation angle $\beta_{pb}$ for the polarized beams of approximately −16.4 degrees and −106.4 degrees. In alternative embodiments, the plate rotation angle $\beta_{pl}$ and the beam rotation angle $\beta_{pb}$ can be greater than or less than the values specifically recited above.

Figure 5C:
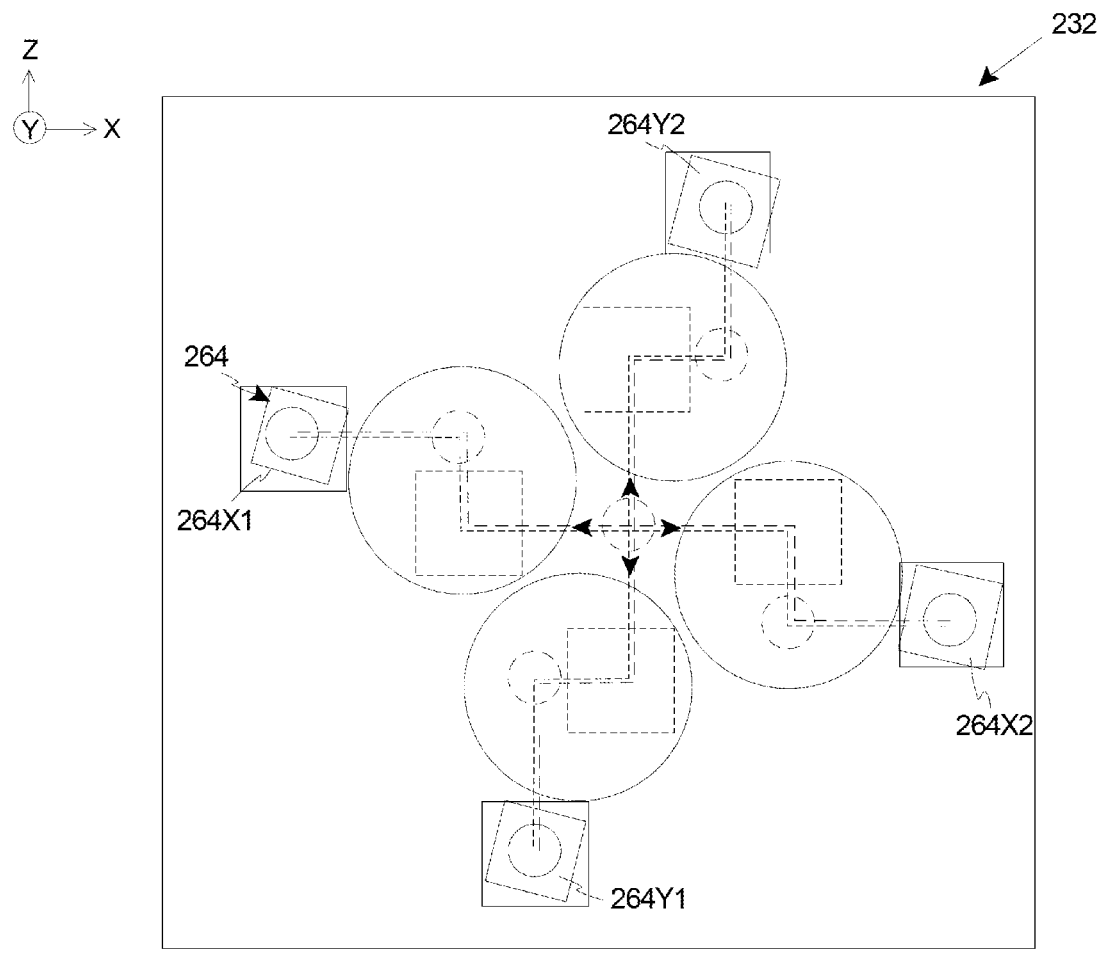
FIG. 5C is a simplified top view of another portion of the encoder assembly illustrated in FIG. 2A.

FIG. 5C is a simplified top view of another portion of the encoder assembly 232 illustrated in FIG. 2B. In particular, in addition to the features also illustrated in FIG. 5A, FIG. 5C further illustrates the rotation of the polarization beam splitters 264 relative to one another about the Z axis, which are nominally rotated relative to the X axis at $\beta_{pb}$.

In certain embodiments, the polarization beam splitters 264 can be rotated about the Z axis by approximately twice the rotation of the second plate 254 (e.g., the half-wave plate, illustrated in FIG. 5B) relative to the X axis, i.e. twice the plate rotation angle $\beta_{pl}$ of the second plate 254 relative to the X axis. With this design, no complicated fold mirrors are required to combine the beams. For example, in one non-exclusive embodiment, wherein the second plate 254 is rotated at a plate rotation angle $\beta_{pl}$ of about −8.2 degrees relative to the X axis, i.e. as shown in FIG. 5B, the polarization beam splitters 264 can be rotated about the Z axis by approximately 16.4 degrees. More specifically, in such embodiment, the first X polarization beam splitter 264X1 and the second X polarization beam splitter 264X2 are rotated relative to one another about the Z axis by approximately 16.4 degrees (i.e. relative to precise alignment along the X axis). Alternatively, the first X polarization beam splitter 264X1 and the second X polarization beam splitter 264X2 can be rotated relative to one another about the Z axis by greater than or less than approximately 16.4 degrees, depending on the orientation of the fast axis of the second plate 254 relative to the X axis. Somewhat similarly, in such embodiment, the first Y polarization beam splitter 264Y1 and the second Y polarization beam splitter 264Y2 are rotated relative to one another about the Z axis by approximately 16.4 degrees (i.e. relative to precise alignment along the Y axis). Alternatively, the first Y polarization beam splitter 264Y1 and the second Y polarization beam splitter 264Y2 can be rotated relative to one another about the Z axis by greater than or less than approximately 16.4 degrees.

Figure 6A:
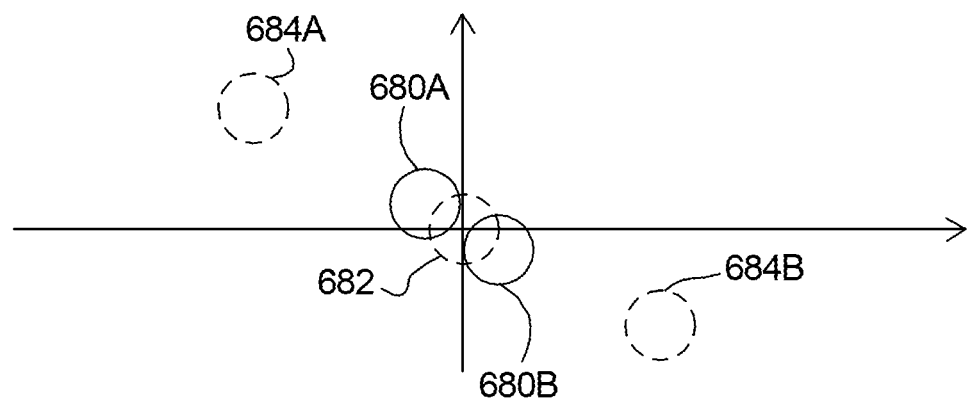
FIG. 6A is a coordinate-based representation of the position of the beams impinging on the stage grating, and the effective measurement points.

FIG. 6A is a coordinate-based representation of the position of the beams impinging on the stage grating 234 (illustrated, for example, in FIG. 2A), and the effective measurement points for signals $S_1$ and $S_2$, i.e. the $S_1$ effective measurement point 680A and the $S_2$ effective measurement point 680B. In FIG. 6A, the dashed circles again represent the beam footprint locations on the stage grating 234, with the first pass beam footprint 682 illustrated as being at the origin, and the second pass $S_1$ footprint 684A and the second pass $S_2$ footprint 684B being spaced apart and angled relative to the axes illustrated in FIG. 6A.

As illustrated in FIG. 6A, the two output beams/signals, which, as noted above, each include both wavelengths $\lambda_1$ and $\lambda_2$, are slightly off-axis in the second pass as a means to inhibit CNLE. Additionally, it should be noted that the $S_1$ effective measurement point 680A and the $S_2$ effective measurement point 680B are shown as being at a different position along the stage grating 234 as compared to the first pass beam footprint 682 (i.e. the origin on the coordinates) for purposes of clarity. In actuality, the $S_1$ effective measurement point 680A and the $S_2$ effective measurement point 680B approximately if not precisely align with the first pass beam footprint 682 (i.e. the origin on the coordinates). Further, since there is no shearing of the measurement beams as the stage grating 234 changes z location, the $S_1$ effective measurement point 680A and the $S_2$ effective measurement point 680B are both fixed relative to the encoder head 236 (illustrated, for example, in FIG. 2A).

Figure 6B:
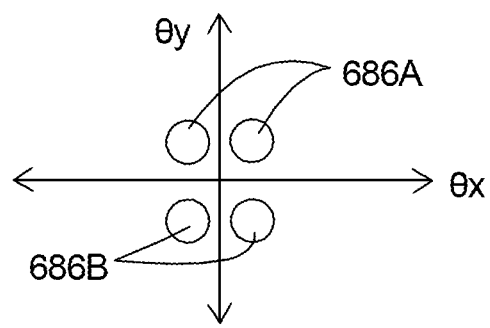
FIG. 6B is a coordinate-based representation of the incident angles of the beams impinging on the stage grating.

Additionally, FIG. 6B is a coordinate-based representation of the incident angles of the beams impinging on the stage grating 234 (illustrated, for example, in FIG. 2A). FIG. 6B illustrates the incident angles of the beams relative to normal incidence on the stage grating 234 (which is shown at the center or origin). As shown in this embodiment, each of the beams is slightly angled away from normal incidence in both the $\Theta_X$ and $\Theta_Y$ directions. Moreover, in this embodiment, the zero order beam angles 686A are shown in the $+\Theta_y$ direction, and the first order beam angles 686B are shown in the $-\Theta_y$ direction. As noted above, the two input beams are slightly off-axis to inhibit CNLE. Subsequently, as will be discussed herein below, in one embodiment, the offset angle can be corrected with the use of a fixed fused silica wedge. Alternatively, other suitable methods may be utilized to compensate for the offset angle.

Figure 7:
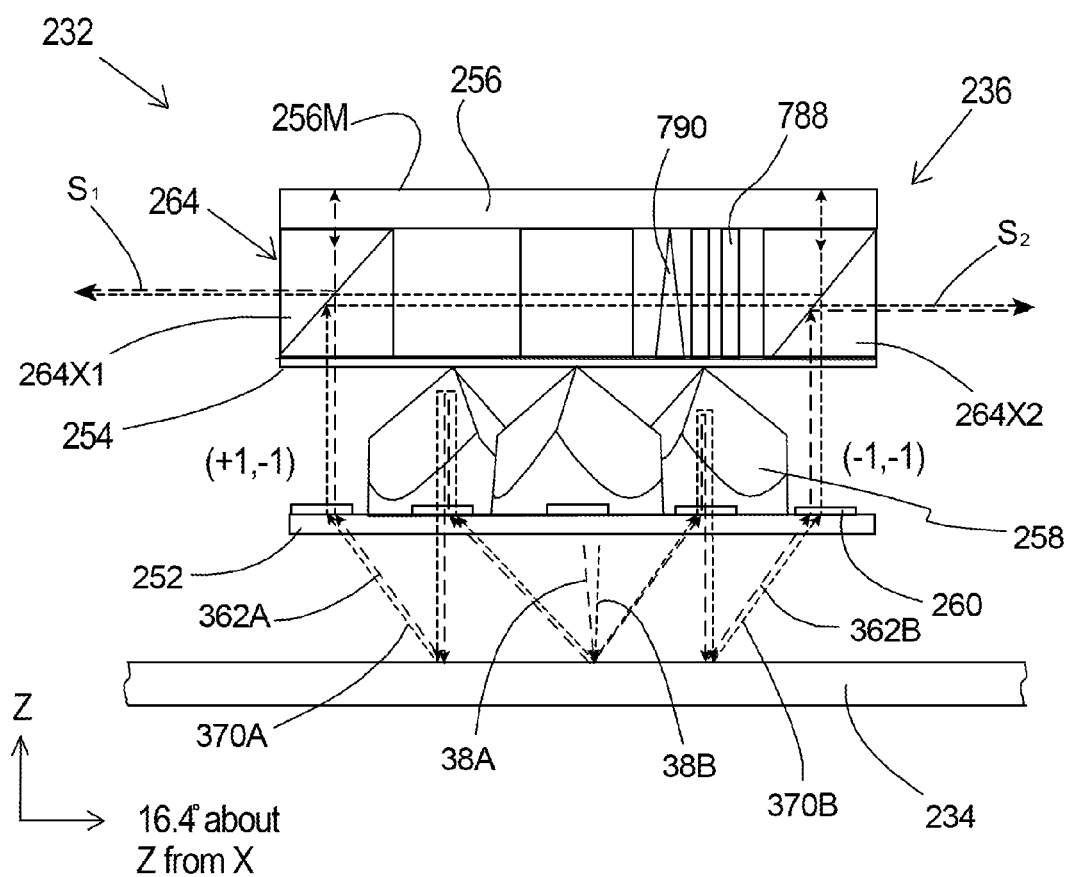
FIG. 7 is a simplified schematic illustration of the encoder assembly illustrated in FIG. 2A.

FIG. 7 is a simplified schematic illustration of the encoder assembly 232 illustrated in FIG. 2A. In particular, FIG. 7 illustrates and describes how a majority of the elements of the encoder head 236 are either common surfaces (i.e. the first plate 252, the second plate 254 and the third plate 256) or redirectors 258, e.g., corner cubes (which when made good enough can't introduce significant tilt error into the beam). Thus, with this design, the polarization beam splitters 264 are the only elements that can misalign the beams; and a single Risley prism pair 788 can be used to align both output beams for the X axis simultaneously.

As illustrated in FIG. 7, the two beams that go out the left, i.e. the (+1, +1) first X measurement beam 362A and the (−1, −1) second X measurement beam 370B that are combined and/or interfered to provide the first X measurement signal $S_1$, both go through the third plate 256 (e.g., the quarter-wave plate) and off the same mirror 256M. The only non-common element is the redirection off of the two polarization beam splitters 264, i.e. one beam goes off of the first X polarization beam splitter 264X1 and the other beam goes off of the second X polarization beam splitter 264X2. Additionally, the two beams that go out the right, i.e. the (+1, +1) second X measurement beam 362B and the (−1, −1) first X measurement beam 370A that are combined and/or interfered to provide the second X measurement signal $S_2$, don't go off the top mirror 256M, but are just redirected by the two polarization beam splitters 264X1, 264X2. Thus, again the polarization beam splitters 264X1, 264X2 are the only non-common element for the beams.

As illustrated, in one embodiment, any error between the parallelism of the diagonal faces of the two polarization beam splitters 264X1, 264X2 can be corrected by the single Risley prism pair 788. In this embodiment, both $\lambda_2$ beams are changed by the Risley prism pair 788, but the same angle setting for the Risley prism pair 788 fixes both measurement signals. Further, the same Risley prism pair 788 can be utilized to correct the angle difference between the two beams introduced at the beginning to prevent CNLE, which eliminates any potential need for a Wollaston prism. Additionally and/or alternatively, a fixed wedge 790 can be included with the Risley prism pair 788 to take up most of the predetermined angle difference due to the collimating lens arrangement of FIG. 2A. For example, as shown in FIG. 7, only the beams that traverse the space between the polarization beam splitters 264X1, 264X2 will be directed through the fixed wedge 790 to make them parallel to the beams that do not go through the fixed wedge 790.

With this design, the interfering beam pairs have the same parity, so there are no beam pointing issues. Additionally, the glass/air path between the two polarization beam splitters 264X1, 264X2 cancels out when the two signals are combined $S_1+S_2=S_x$. Additionally, the present design further enables correction for any fiber error based on the combination of the two signals $S_1$ and $S_2$.

Additionally, it should further be noted that in FIG. 7, the vertical direction represents the Z axis, and, with the polarization beam splitters 264X1, 264X2 being rotated about the Z axis by approximately 16.4 degrees (in one non-exclusive embodiment, as described above), the horizontal direction represents approximately 16.4 degrees about the Z axis from the X axis.

Further, as provided herein, the two wavelengths, e.g., the first measurement beam 38A at the first wavelength $\lambda_1$ and the second measurement beam at the second wavelength $\lambda_2$ (only a portion of these beams 38A, 38B are illustrated in FIG. 7) travel a common path until they hit the stage grating 234. Additionally, the beam adjusters 260 that are utilized to correct the diffraction angle of the beams are all on the same optical surface, so unless there are large lithography errors during the printing of these beam adjusters 260, there are no misalignments introduced. Further, the fabrication of the redirectors 258, e.g., the corner cubes, should be good enough to prevent large misalignments. Still further, the second plate 254, i.e. the half-wave plate, is a single optical element that is traversed by all of the measurement beams in a similar manner, so no misalignment between the measurement beams is introduced.

As noted herein above, although the polarization beam splitters 264X1, 264X2 are different elements and can be misaligned, the non-parallelism of the diagonal surfaces of the polarization beam splitters 264X1, 264X2 can be corrected by the single Risley prism pair 788 for both X measurement signals ($S_1$ and $S_2$).

Although the above-described Figures only illustrate the utilization of a single encoder head 236, it should be noted that the encoder assembly 232 can use multiple encoder heads 236 to measure the position of the stage 20A and thus the stage grating 234 at any given time. Moreover, the encoder assembly 232 can utilize multiple measurement points at any given time (i.e. from a single encoder head 236 or from multiple encoder heads 236) to more precisely measure the position of the stage 20A and thus the stage grating 234 along the X axis and along the Y axis. In one embodiment, the encoder assembly 232 can utilize four measurement points (also sometimes referred to as "pods") at any given time. With each measurement point (or "pod") potentially generating four measurement signals (i.e. two X measurement signals and two Y measurement signals), a total of sixteen measurement signals can be generated. It should further be noted that less than all of such potential measurement signals can be utilized. For example, in one embodiment, only one measurement signal is used for each measurement point in the X and Y directions, for a total of eight measurement signals being utilized from the four measurement points. Alternatively, the encoder assembly 232 can utilize more than four or less than four measurement points at any given time on the stage grating 234.

Figure 8:
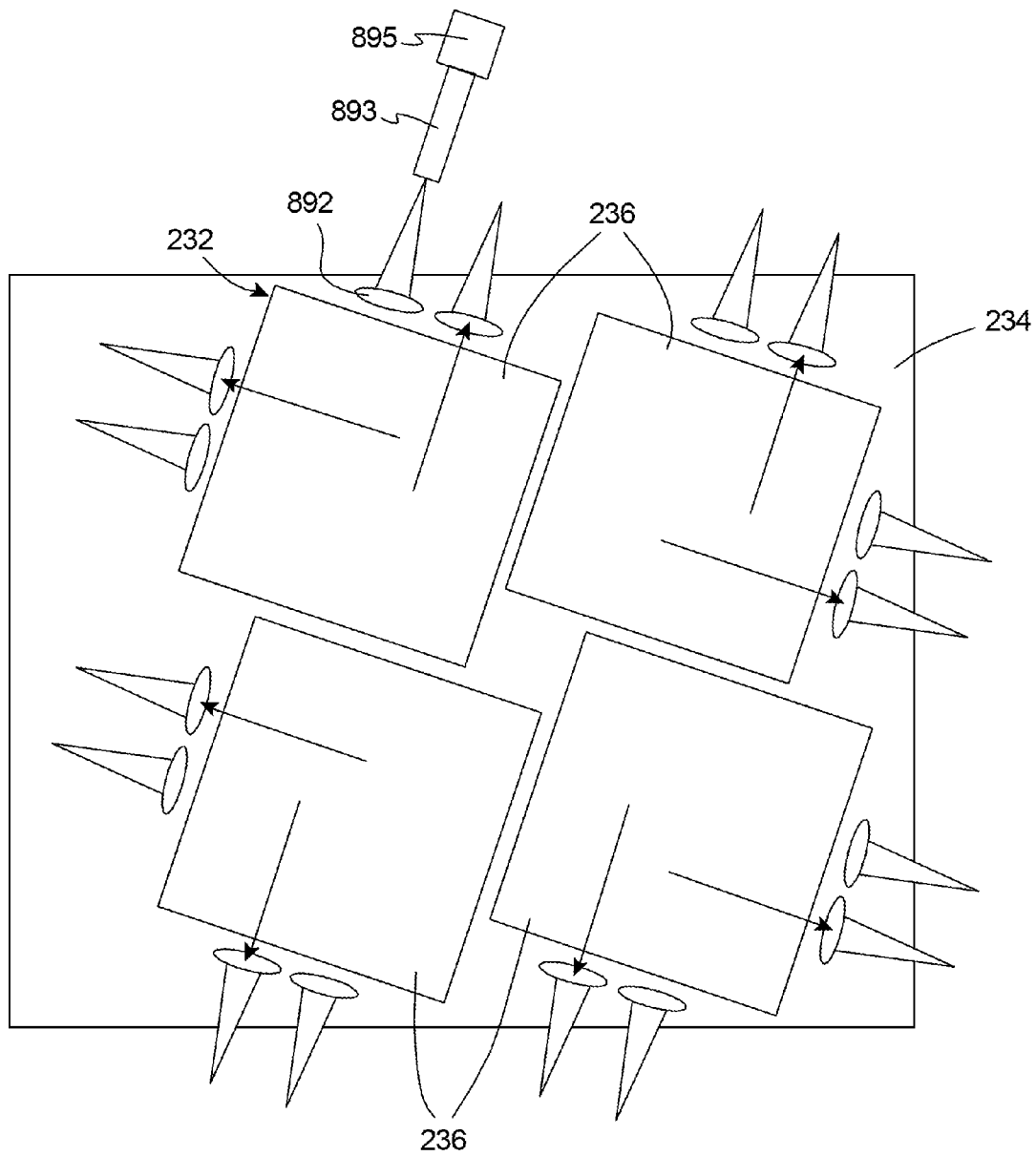
FIG. 8 is a simplified top view of the encoder assembly illustrated in FIG. 2A.

FIG. 8 is a simplified top view of the encoder assembly 232 illustrated in FIG. 2A. In particular, FIG. 8 illustrates the stage grating 234 and four encoder heads 236 (or "pods") that each generate signals from individual measurement points on the stage grating 234. Moreover, FIG. 8 further illustrates output lenses 892 that are used to properly focus the output (measurement) signals that are generated by the encoder heads 236 into suitable multi-mode output fibers 893 (only one is illustrated) that are used to carry the output signals to appropriate detectors 895 (one is illustrated as a box).

During movement of the stage, e.g., the wafer stage 20A illustrated in FIG. 1, at least a portion of the stage grating 234 is positioned substantially directly below one or more of the encoder heads 236 at any given time. Based on the design of the encoder assembly 232, as provided in detail herein, although sixteen spatially separated collimating lens/fiber outputs (eight pairs) are needed, no other output fold mirrors are required to get the output signals to the output lenses 892 and/or the output fibers.

It should be noted that in FIG. 8 sixteen output lenses 892 are illustrated, with one output lens 892 for each of the sixteen output (measurement) signals that may be generated in a system utilizing four encoder heads 236 (or four "pods"). With this system, four measurement locations are provided, with each measurement location providing two X measurements and two Y measurements, for a total of sixteen output (measurement) signals. However, as noted above, less than all of the sixteen measurement signals can be utilized. For example, in one embodiment, only one measurement signal is used for each measurement point in the X and Y directions, for a total of eight measurement signals being utilized.

Based on this design as described in detail herein, the encoder assembly 232 uses the double pass approach with beam adjusters 260 to correct the diffraction angle and to prevent shearing as the stage grating 234 changes z position relative to the encoder head 236. Moreover, both of the first measurement beam 38A (at the first wavelength $\lambda_1$) and the second measurement beam 38B (at the first wavelength $\lambda_2$) are incident on the stage grating 234 together (i.e. at least approximately, if not precisely, at the same location), but with a small angle difference, $\Theta$, between them. Therefore, two heterodyne X measurement signals, $S_1$ and $S_2$, are created, with both measurement signals $S_1$, $S_2$ measuring movement and/or positioning of the stage 20A and thus the stage grating 234 in the X direction. Somewhat similarly, two heterodyne Y measurement signals, $S_3$ and $S_4$, are created, with both measurement signals $S_3$, $S_4$ measuring movement and/or positioning of the stage 20A and thus the stage grating 234 in the Y direction.

More particularly, (i) the first X measurement signal, $S_1$, is the combination (i.e. interference) of the (+1, +1) first ($\lambda_1$) X measurement beam ($\lambda_1$(+1, +1)) and the (−1, −1) second ($\lambda_2$) X measurement beam ($\lambda_2$(−1, −1)), thus realizing 4× sensitivity; (ii) the second X measurement signal, $S_2$, is the combination (i.e. interference) of the (+1, +1) second ($\lambda_2$) X measurement beam ($\lambda_2$(+1, +1)) and the (−1, −1) first ($\lambda_1$) X measurement beam ($\lambda_1$(−1, −1)), thus also realizing 4× sensitivity; (iii) the first Y measurement signal, $S_3$, is the combination (i.e. interference) of the (+1, +1) first ($\lambda_i$) Y measurement beam ($\lambda_1$(+1, +1)) and the (−1, −1) second ($\lambda_2$) Y measurement beam ($\lambda_2$(−1, −1)), thus realizing 4x sensitivity; and (iv) the second Y measurement signal, $S_4$, is the combination (i.e. interference) of the (+1, +1) second ($\lambda_2$) Y measurement beam ($\lambda_2$(+1, +1)) and the (−1, −1) first ($\lambda_1$) Y measurement beam ($\lambda_1$(−1, −1)), thus also realizing 4× sensitivity. Accordingly, the encoder assembly 232 in this example can realize a total combined sensitivity in the X direction of $S_X=S_1+S_2=8\times$, and a total combined sensitivity in the Y direction of $S_Y=S_3+S_4=8\times$. Moreover, this enables the encoder assembly 232 to realize twice the sensitivity that can be realized in a system where the reference beam stays within the encoder head and is not directed at the stage grating.

Further, besides the increased sensitivity, another advantage of the present design is that no traditional reference beam (which remains within the encoder head) is required to compensate for fiber errors. In particular, because opposite wavelengths are used for the two measurement beams, any fiber errors that may otherwise be present e.g., due to any small temperature changes, can be effectively canceled out. This means fewer parts, easier alignment, much smaller non-common path, and overall ease of path matching. Moreover, because both the first measurement beam 38A and the second measurement beam 38B ultimately pass the same number of times through the top and bottom of the first plate 252, the same number of times through the second plate 254, and reflect the same number of times off the mirror 256M of the third plate 256, proper alignment of the beams is relatively easy to maintain, with the only issue being the use of alternative polarization beam splitters 264. It should be noted that if only one X or Y measurement signal is utilized for a "pod", a traditional reference signal to correct for fibers errors may be required, since in such a situation the combination of $S_1$ and $S_2$ is no longer available to correct any fiber error.

In summary, with the present design, the problem of needing to measure the X and Y position of the wafer stage 20A accurately and compactly is solved with a unique and simple design that enables a minimal number of output fibers, and a minimal number of Risley adjustments through the use of only a few, common parts where the output signals result in 8× sensitivity (e.g., where 1.0 nm of X motion results in a corresponding 8.0 nm of signal change). More particularly, this type of encoder assembly 232 requires only a few specialized parts (stage grating 234, half-wave plate 254, quarter-wave plate 256 with mirror 256M, non-standard PBS 264X1), but it can be assembled relatively easily since the alignment of very few of the components is actually critical to beam angle. Moreover, the total part count is very low considering that sixteen measurement signals are created. Additionally, the sensitivity of the encoder assembly 232 is two times what is possible with currently available XZ/YZ encoder heads for a given grating pitch.

The above embodiments were described as examples of the projection exposure apparatus of the step-and-scan method, but the present invention is also applicable to the AF sensor in the projection exposure apparatus of the step-and-repeat method. The present invention is further applicable to the encoder system in liquid immersion type exposure apparatus, for example, as disclosed in U.S. Patent Application Publication No. 2011/0086315.

Further, illumination light is not limited to ArF excimer laser light (with a wavelength of 193 nm), but can also include ultraviolet light such as described in, for example, U.S. Pat. No. 7,023,610; a harmonic wave, which is obtained by amplifying a single-wavelength laser beam in the infrared or visible range emitted by a DFB semiconductor laser or fiber laser with a fiber amplifier doped with, for example, erbium (or both erbium and ytterbium), with the wavelength being converted into ultraviolet light using a nonlinear optical crystal, can also be used as vacuum ultraviolet light.

Further, in the embodiment above, a light transmissive type mask (reticle) is used, which is obtained by forming a predetermined light-shielding pattern (or a phase pattern or a light-attenuation pattern) on a light-transmitting substrate, as disclosed in, for example, U.S. Pat. No. 6,778,257. Alternatively, an electron mask (which is also called a variable shaped mask, an active mask or an image generator, and includes, for example, a DMD (Digital Micromirror Device) that is a type of a non-emission type image display element (spatial light modulator) or the like) on which a light-transmitting pattern, a reflection pattern, or an emission pattern is formed according to electronic data of the pattern that is to be exposed can also be used. In the case of using such a variable shaped mask, a stage on which a work piece, e.g., a wafer, a glass plate or the like, is mounted is scanned relative to the variable shaped mask, and therefore the equivalent effect to the embodiment above can be obtained by measuring the position of this stage using an encoder system.

Further, as disclosed in, for example, PCT International Publication No. 2001/035168, the embodiment above can also be applied to an exposure apparatus (a lithography system) in which line-and-space patterns are formed on wafer 234 by forming interference fringes on wafer 234.

Moreover, the embodiment above can also be applied to an exposure apparatus that synthesizes two reticle patterns on a wafer via a projection optical system and substantially simultaneously performs double exposure of one shot area on the wafer by one scanning exposure, as disclosed in, for example, U.S. Pat. No. 6,611,316.

Incidentally, an object on which a pattern is to be formed (an object subject to exposure on which an energy beam is irradiated) in the embodiment above is not limited to a wafer, but may be another object such as a glass plate, a ceramic substrate, a film member, or a mask blank.

The usage of the exposure apparatus is not limited to the exposure apparatus used for manufacturing semiconductor devices. For example, the embodiment above can also be widely applied to an exposure apparatus for manufacturing liquid crystal display elements in which a liquid crystal display element pattern is transferred onto a rectangular glass plate, and to an exposure apparatus for manufacturing organic EL, thin-film magnetic heads, imaging devices (such as CCDs), micromachines, DNA chips or the like. Further, the embodiment above can also be applied to an exposure apparatus that transfers a circuit pattern onto a glass substrate, a silicon wafer or the like not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

The surface position detecting apparatus and exposure apparatus according to the foregoing embodiments are manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; and adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies of the entire exposure apparatus. The manufacture of the exposure apparatus is desirably performed in a clean room in which the temperature, cleanliness, etc. are controlled.

Incidentally, the disclosures of all publications, the PCT International Publications, the U.S. Patent Application Publications and the U.S. patents that are cited in the description so far related to exposure apparatuses and the like are each incorporated herein by reference.

Figure 9A:
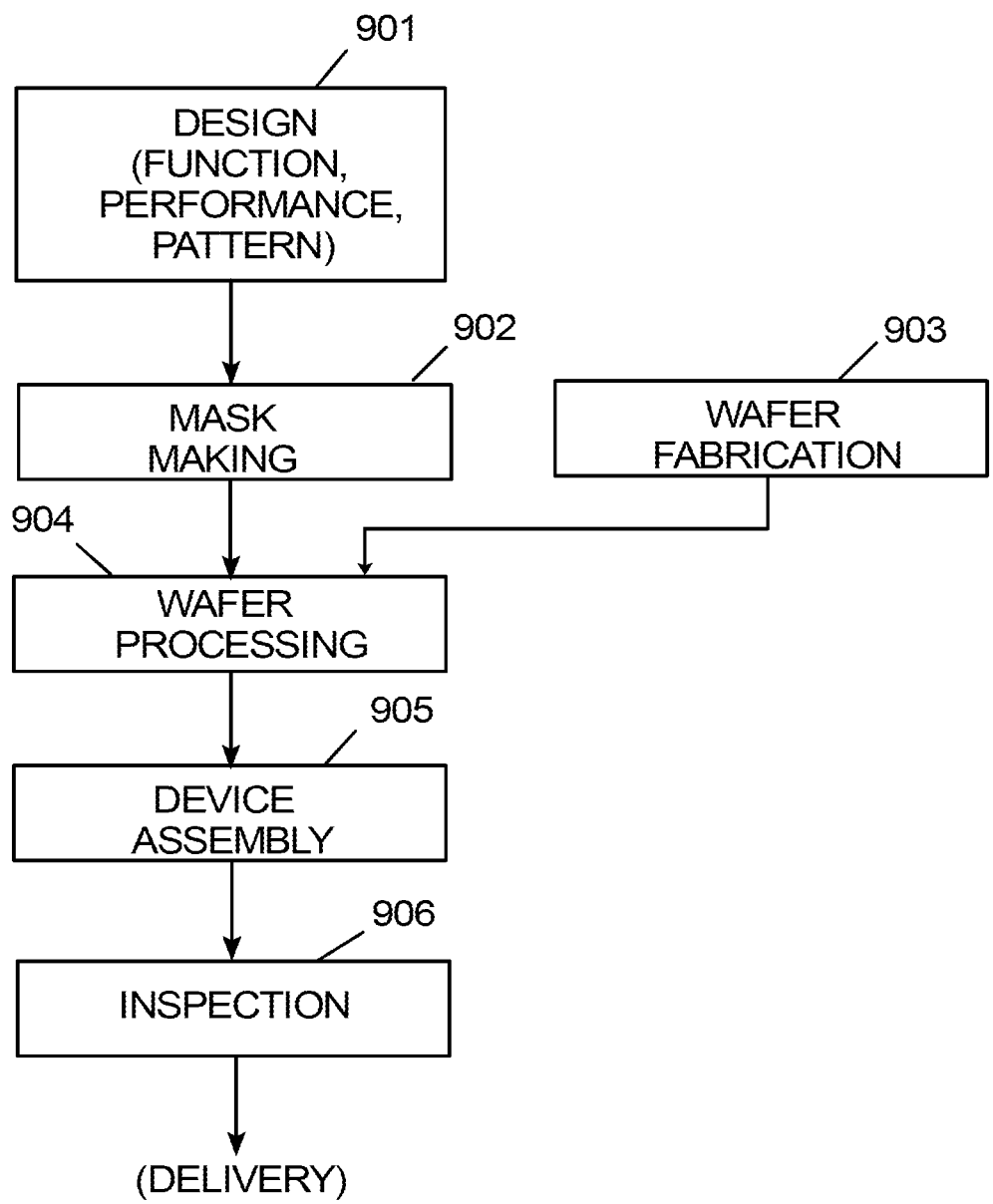
FIG. 9A is a flow chart that outlines a process for manufacturing a device in accordance with the present embodiment.

Semiconductor devices can be fabricated using the above described systems, by the process shown generally in FIG. 9A. In step 901, the device's function and performance characteristics are designed. Next, in step 902, a mask (reticle) having a pattern is designed according to the previous designing step, and in a parallel step 903, a wafer is made from a silicon material. In step 904, the mask pattern designed in step 902 is exposed onto the wafer from step 903 by a photolithography system described hereinabove in accordance with the present embodiment. In step 905, the semiconductor device is assembled (including the dicing process, bonding process and packaging process). Finally, the device is then inspected in step 906.

Figure 9B:
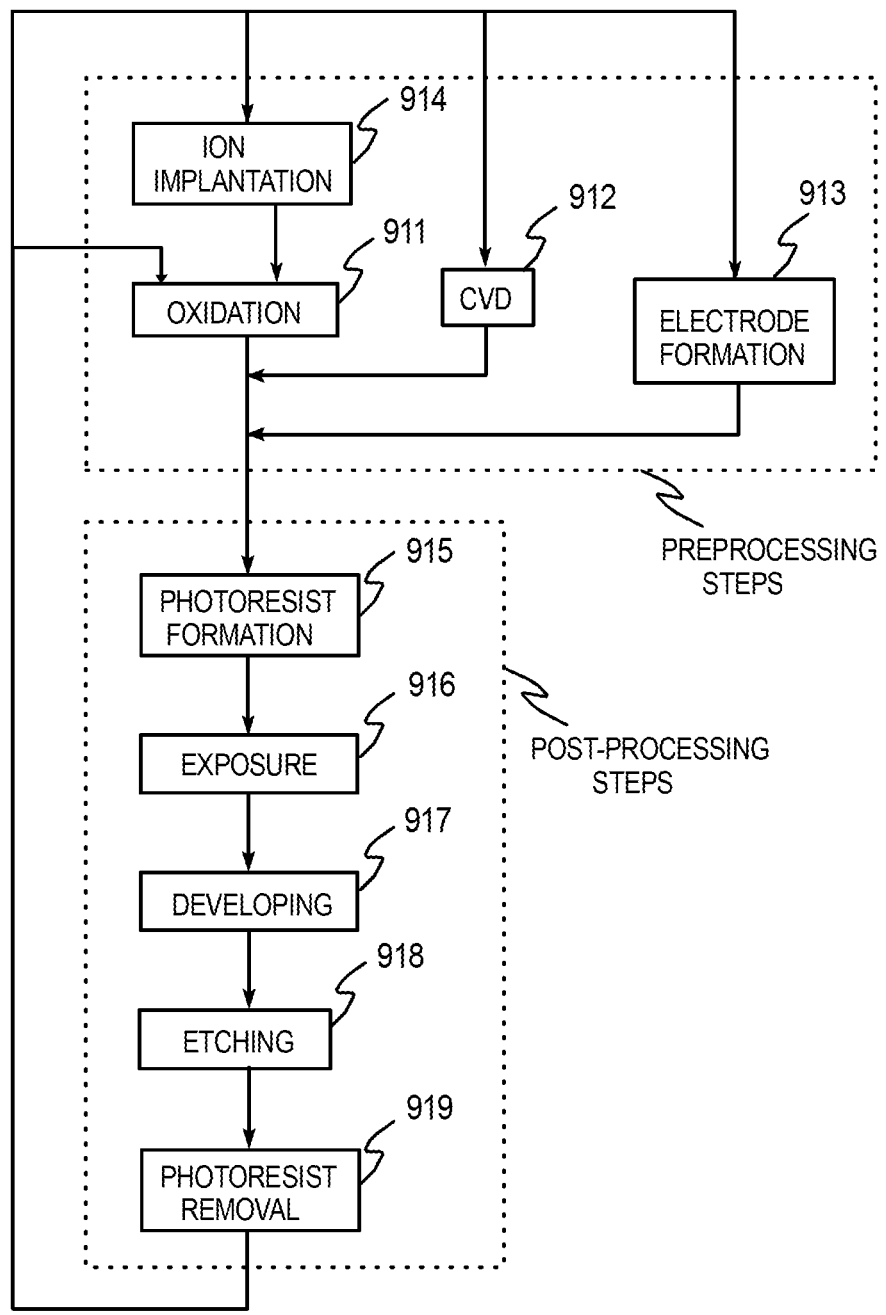
FIG. 9B is a flow chart that outlines device processing in more detail.

FIG. 9B illustrates a detailed flowchart example of the above-mentioned step 904 in the case of fabricating semiconductor devices. In FIG. 9B, in step 911 (oxidation step), the wafer surface is oxidized. In step 912 (CVD step), an insulation film is formed on the wafer surface. In step 913 (electrode formation step), electrodes are formed on the wafer by vapor deposition. In step 914 (ion implantation step), ions are implanted in the wafer. The above mentioned steps 911-914 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 915 (photoresist formation step), photoresist is applied to a wafer. Next, in step 916 (exposure step), the above-mentioned exposure device is used to transfer the circuit pattern of a mask (reticle) to a wafer. Then in step 917 (developing step), the exposed wafer is developed, and in step 918 (etching step), parts other than residual photoresist (exposed material surface) are removed by etching. In step 919 (photoresist removal step), unnecessary photoresist remaining after etching is removed. Multiple circuit patterns are formed by repetition of these preprocessing and post-processing steps.

While a number of exemplary aspects and embodiments of a measurement system 22 and an encoder assembly 32 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A measurement system for measuring relative movement between a first member and a second member, the measurement system comprising:
    a grating that is coupled to one of the first member and the second member; and
    an encoder head that is coupled to the other of the first member and the second member;
    wherein the encoder head directs a first measurement beam at the grating at a first angle, the first measurement beam being at a first wavelength, and directs a second measurement beam at the grating at a second angle that is different than the first angle, the second measurement beam being at a second wavelength that is different than the first wavelength; and
    wherein at least a portion of the first measurement beam that is diffracted at least twice by the grating and at least a portion of the second measurement beam that is diffracted at least twice by the grating are interfered with one another to create a measurement signal along a signal axis.

2. The measurement system of claim 1 wherein the grating is a two-dimensional grating.

3. The measurement system of claim 1 wherein the first measurement beam and the second measurement beam are directed together at the grating.

4. The measurement system of claim 1 wherein the encoder head includes a first redirector and a second redirector; wherein the first measurement beam is diffracted by the grating to create at least a +1 first order beam and a −1 first order beam; and wherein the +1 first order beam is directed at the first redirector, and the −1 first order beam is directed at the second redirector.

5. The measurement system of claim 4 wherein the first redirector redirects the +1 first order beam back at the grating, and wherein the second redirector redirects the −1 first order beam back at the grating.

6. The measurement system of claim 4 wherein the encoder head further includes a first beam adjuster that is positioned near the first redirector and a second beam adjuster that is positioned near the second redirector; wherein the +1 first order beam is directed at first beam adjuster to correct the diffraction angle of the +1 first order beam; and wherein the −1 first order beam is directed at the second beam adjuster to correct the diffraction angle of the −1 first order beam.

7. The measurement system of claim 1 wherein the first measurement beam is directed twice at the grating to create a (+1, +1) first measurement beam and a (−1, −1) first measurement beam.

8. The measurement system of claim 7 wherein the encoder head includes a first plate, and wherein the (+1, +1) first measurement beam and the (−1, −1) first measurement beam are directed through the first plate to rotate a polarization state of each of the (+1, +1) first measurement beam and the (−1, −1) first measurement beam.

9. The measurement system of claim 8 wherein the encoder head further includes a first polarization beam splitter and a second polarization beam splitter that are coupled to the first plate; wherein the first plate rotates the polarization state of the (+1, +1) first measurement beam to line up with the first polarization beam splitter; and wherein the first plate rotates the polarization state of the (−1, −1) first measurement beam to line up with the second polarization beam splitter.

10. The measurement system of claim 9 wherein the first polarization beam splitter is a non-standard polarization beam splitter that transmits s-polarized light and reflects p-polarized light; and wherein the second polarization beam splitter is a standard polarization beam splitter that reflects s-polarized light and transmits p-polarized light.

11. The measurement system of claim 7 wherein the second measurement beam is directed twice at the grating to create a (+1, +1) second measurement beam and a (−1, −1) second measurement beam, wherein the (+1, +1) second measurement beam is interfered with the (−1, −1) first measurement beam to create a first measurement signal along a first signal axis, and wherein the (−1, −1) second measurement beam is interfered with the (+1, +1) first measurement beam to create a second measurement signal along a second signal axis.

12. An exposure apparatus including a stage assembly that positions a work piece, and the measurement system of claim 1 that measures the position of the work piece.

13. A process for manufacturing a wafer that includes the steps of providing a substrate, and transferring a mask pattern to the substrate with the exposure apparatus of claim 12.

14. A measurement system for measuring relative movement between a first member and a second member, the measurement system comprising:
    a grating coupled to one of the first member and the second member; and
    an encoder head that is coupled to the other of the first member and the second member;
    wherein a measurement beam and a reference beam are directed together at the grating; wherein at least a portion of the measurement beam and at least a of the reference beam are interfered with one another to create a measurement signal along a signal axis; and wherein the measurement beam and the reference beam are each diffracted at least twice by the grating.

15. The measurement system of claim 14 wherein the measurement beam is at a first wavelength and the reference beam is at a second wavelength that is different than the first wavelength.

16. The measurement system of claim 15 wherein the measurement beam is directed at the grating at a first angle and the reference beam is directed at the grating at a second angle that is different than the first angle.

17. The measurement system of claim 14 wherein the grating is a two-dimensional grating.

18. The measurement system of claim 14 wherein the measurement beam is directed twice at the grating to create a (+1, +1) measurement beam and a (−1, −1) measurement beam.

19. The measurement system of claim 18 wherein the reference beam is directed twice at the grating to create a (+1, +1) reference beam and a (−1, −1) reference beam, wherein the (+1, +1) reference beam is interfered with the (−1, −1) measurement beam, and wherein the (−1, −1) reference beam is interfered with the (+1, +1) measurement beam.

20. A method for measuring relative movement between a first member and a second member, the method comprising the steps of:
- directing a first measurement beam at a grating that is coupled to one of the first member and the second member at a first angle, the first measurement beam being at a first wavelength;
- directing a second measurement beam at the grating at a second angle, the second angle being different than the first angle, and the second measurement beam being at a second wavelength that is different than the first wavelength; and
- interfering at least a portion of the first measurement beam and at least a portion of the second measurement beam with one another to create a measurement signal along a signal axis,
- wherein the first measurement beam and the second measurement beam are each diffracted at least twice by the grating.

21. The method of claim 20 wherein the steps of directing the first measurement beam and directing the second measurement beam occur substantially simultaneously such that the first measurement beam and the second measurement beam are directed together at the grating.

22. The method of claim 20 further comprising the steps of diffracting the first measurement beam with the grating to create at least a +1 first order beam and a −1 first order beam; directing the +1 first order beam at a first redirector; and directing the −1 first order beam at a second redirector.

23. The method of claim 22 further comprising the steps of redirecting the +1 first order beam back at the grating with the first redirector; and redirecting the −1 first order beam back at the grating with the second redirector.

24. The method of claim 20 wherein the step of directing the first measurement beam includes the step of directing the first measurement beam twice at the grating to create a (+1, +1) first measurement beam and a (−1, −1) first measurement beam.

25. The method of claim 24 further comprising the step of rotating a polarization state of each of the (+1, +1) first measurement beam and the (−1, −1) first measurement beam with a first plate.

26. The method of claim 25 wherein the step of rotating includes the steps of rotating the polarization state of the (+1, +1) first measurement beam with the first plate to line up with a first polarization beam splitter that is secured to the first plate; and rotating the polarization state of the (−1, −1) first measurement beam with the first plate to line up with a second polarization beam splitter that is secured to the first plate.

27. The method of claim 26 wherein the step of rotating the polarization state of the (+1, +1) first measurement beam includes the first polarization beam splitter being a non-standard polarization beam splitter that transmits s-polarized light and reflects p-polarized light; and wherein the step of rotating the polarization state of the (−1, −1) first measurement beam includes the second polarization beam splitter being a standard polarization beam splitter that reflects s-polarized light and transmits p-polarized light.

28. The method of claim 24 wherein the step of directing the second measurement beam includes the step of directing the second measurement beam twice at the grating to create a (+1, +1) second measurement beam and a (−1, −1) second measurement beam, and further comprising the steps of interfering the (+1, +1) second measurement beam with the (−1, −1) first measurement beam to create a first measurement signal along a first signal axis, and interfering the (−1, −1) second measurement beam with the (+1, +1) first measurement beam to create a second measurement signal along a second signal axis.

29. A method for exposing a work piece, the method comprising the steps of positioning the work piece with a stage assembly, and measuring the position of the work piece with the method of claim 20.

30. A measurement system for measuring relative movement between a first member and a second member, the second member being movable relative to the first member at least in a first direction, the measurement system comprising:
- a reflective-type diffraction grating provided on one of the first member and the second member, the reflective-type diffraction grating having a grating pattern having a periodic direction in at least the first direction; and
- an encoder head which is provided on the other of the first member and the second member,
- wherein the encoder head (i) directs a measurement beam to a first position on the grating pattern of the reflective-type diffraction grating, (ii) redirects a first diffraction beam which is generated via diffraction of the measurement beam from the diffraction grating in relation to the first direction to a second position on the grating pattern of the reflective-type diffraction grating, and (iii) redirects a second diffraction beam, of which order is different from that of the first diffraction beam and which is generated via diffraction of the first measurement beam from the diffraction grating in relation the first direction to a third position on the grating pattern of the reflective-type diffraction grating,
- wherein a first plane including the first position and beam propagating paths of the first diffraction beam and the second diffraction beam is arranged between the second and third positions, and
- wherein a second plane which is perpendicular to the first plane is arranged between the second and third positions.

31. The measurement system of claim 30 wherein the encoder head includes a first redirector that redirects the first diffraction beam and a second redirector that redirects the second diffraction beam.

32. The measurement system of claim 30 wherein the reflective-type diffraction grating is a two-dimensional grating, and wherein the grating pattern has a periodic pattern in the first direction and in a second direction that is substantially orthogonal to the first direction.

33. The measurement system of claim 32 wherein the encoder head (i) redirects a third diffraction beam which is generated via diffraction of the measurement beam from the diffraction grating in relation to the second direction to a fourth position on the grating pattern of the reflective-type diffraction grating, and (ii) redirects a fourth diffraction beam, of which order is different from that of the third diffraction beam and which is generated via diffraction of the measurement beam from the diffraction grating in relation the second direction to a fifth position on the grating pattern of the reflective-type diffraction grating, and
- wherein the second plane including the first position and beam propagating paths of the third diffraction beam and the fourth diffraction beam is arranged between the fourth and fifth positions.

34. The measurement system of claim 33 wherein the first plane is arranged between the fourth position and the fifth position.

35. The measurement system of claim 31 wherein the encoder head (i) redirects a third diffraction beam which is generated via diffraction of the measurement beam from the diffraction grating in relation to a second direction to a fourth position on the grating pattern of the reflective-type diffraction grating, and (ii) redirects a fourth diffraction beam, of which order is different from that of the third diffraction beam and which is generated via diffraction of the measurement beam from the diffraction grating in relation the second direction to a fifth position on the grating pattern of the reflective-type diffraction grating, and wherein the second plane including the first position and beam propagating paths of the third diffraction beam and the fourth diffraction beam is arranged between the fourth and fifth positions.

36. The measurement system of claim 35 wherein the encoder head includes a third redirector that redirects the third diffraction beam and a fourth redirector that redirects the fourth diffraction beam.

37. An exposure apparatus including a stage assembly that positions a work piece, and the measurement system of claim 30 that measures the position of the work piece.

38. A process for manufacturing a wafer that includes the steps of providing a substrate, and transferring a mask pattern to the substrate with the exposure apparatus of claim 37.

* * * * *

UNITED STATES PATENT AND TRADEMARK OFFICE
CERTIFICATE OF CORRECTION

Page 1 of 1

PATENT NO.         : 9,243,896 B2
APPLICATION NO.    : 13/796316
DATED              : January 26, 2016
INVENTOR(S)        : Eric Peter Goodwin It is certified that error appears in the above-identified patent and that said Letters Patent is hereby corrected as shown below:

In the Claims:

Column 28, Claim 14, Line 44, insert -- portion -- after "a" and before "of".

Signed and Sealed this
Twenty-sixth Day of April, 2016

Michelle K. Lee
*Director of the United States Patent and Trademark Office*